(12) United States Patent
Shimoda et al.

(10) Patent No.: US 7,732,019 B2
(45) Date of Patent: Jun. 8, 2010

(54) SOLUTION SPRAY APPARATUS AND SOLUTION SPRAY METHOD

(75) Inventors: Satoru Shimoda, Fussa (JP); Tomoyuki Shirasaki, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/013,946

(22) Filed: Jan. 14, 2008

(65) Prior Publication Data

US 2008/0118629 A1 May 22, 2008

Related U.S. Application Data

(60) Continuation of application No. 11/048,509, filed on Jan. 31, 2005, now Pat. No. 7,395,976, which is a division of application No. 10/763,613, filed on Jan. 22, 2004, now Pat. No. 6,908,045.

(30) Foreign Application Priority Data

Jan. 28, 2003 (JP) ............................. 2003-018543
Jan. 28, 2003 (JP) ............................. 2003-018578

(51) Int. Cl.
*B05D 1/02* (2006.01)
(52) U.S. Cl. .................. 427/424; 427/422; 239/13; 239/128; 239/134; 239/135; 239/303; 239/75; 239/549; 118/302; 118/729
(58) Field of Classification Search .......... 239/102.1, 239/102.2, 125, 128, 133, 134, 135, 139, 239/75, 303–305, 548–550, 13; 118/300, 118/728, 302, 729; 427/168, 314, 422, 424
See application file for complete search history.

(56) References Cited

U.S. PATENT DOCUMENTS

| 2,647,017 A | 7/1953 | Coulliette |
| 2,670,238 A | 2/1954 | Lansing et al |
| 3,049,302 A | 8/1962 | Simmons, Jr |
| 4,224,355 A | 9/1980 | Lampkin et al. |
| 4,244,447 A | 1/1981 | Hanitz |

(Continued)

FOREIGN PATENT DOCUMENTS

JP            61-278376 A       12/1986

(Continued)

OTHER PUBLICATIONS

Japanese Office Action dated Dec. 2, 2008 and English translation thereof issued in counterpart Japanese application No. 2003-018543.

(Continued)

*Primary Examiner*—Steven J Ganey
(74) *Attorney, Agent, or Firm*—Frishauf, Holtz, Goodman & Chick, P.C.

(57) ABSTRACT

A solution spray apparatus includes a nozzle which sprays a droplet of a solution such as EL solution, a heater is provided on the nozzle to heat the solution in the nozzle to a temperature lower than a boiling point of the solution in the nozzle, so that the droplet of the heated solution is ejected from the spray to an object.

18 Claims, 8 Drawing Sheets

U.S. PATENT DOCUMENTS

| | | | |
|---|---|---|---|
| 4,344,571 A | 8/1982 | Kundig | |
| 5,002,928 A | 3/1991 | Fukui et al. | |
| 5,459,811 A | 10/1995 | Glovan et al. | |
| 6,012,647 A | 1/2000 | Ruta et al. | |
| 6,319,321 B1 | 11/2001 | Hiraga et al. | |
| 6,632,325 B2 | 10/2003 | Lingampalli | |
| 6,666,385 B1 | 12/2003 | Gonitzke | |
| 6,730,357 B2 | 5/2004 | Kawase | |
| 6,789,744 B2 | 9/2004 | Bissonnette et al. | |
| 6,800,333 B2 | 10/2004 | Choy et al. | |
| 6,800,498 B2 | 10/2004 | Bright et al. | |
| 7,067,178 B2 | 6/2006 | Muto et al. | |
| 7,183,008 B1 | 2/2007 | Kathirgamanathan | |
| 2002/0137455 A1 | 9/2002 | Ivanov et al. | |
| 2003/0141382 A1 | 7/2003 | Bissonnette et al. | |
| 2004/0115339 A1 | 6/2004 | Ito | |

FOREIGN PATENT DOCUMENTS

| | | | |
|---|---|---|---|
| JP | 2-73356 A | 3/1990 | |
| JP | 3-234632 A | 10/1991 | |
| JP | 4-115520 A | 4/1992 | |
| JP | 5-281562 A | 10/1993 | |
| JP | 7-124506 A | 5/1995 | |
| JP | 7-313921 A | 12/1995 | |
| JP | 9-181432 A | 7/1997 | |
| JP | 10-202153 A | 8/1998 | |
| JP | 2000-106278 A | 4/2000 | |
| JP | 2001-113214 A | 4/2001 | |
| JP | 2001-291588 A | 10/2001 | |
| JP | 2002-177847 A | 6/2002 | |
| JP | 2003-019795 A | 1/2003 | |
| JP | 2003-133692 A | 5/2003 | |
| JP | 2003-251261 A | 9/2003 | |
| JP | 2003-527955 T | 9/2003 | |
| JP | 2003-283102 A | 10/2003 | |
| JP | 2004-111278 A | 4/2004 | |
| JP | 2004-223914 A | 8/2004 | |
| TW | 353199 | 2/1999 | |
| TW | 515341 | 12/2002 | |
| WO | WO99/48339 A1 | 9/1999 | |
| WO | WO 01/70506 A2 | 9/2001 | |

OTHER PUBLICATIONS

Japanese Office Action dated Dec. 2, 2008 and English translation thereof issued in counterpart Japanese application No. 2003-018578.

Chinese Office Action dated Aug. 21, 2009 and English translation thereof issued in a counterpart Chinese Application No. 2004100035327.

Japanese Office Action dated Jul. 21, 2009 (2 pages), and English translation thereof (3 pages), issued in counterpart Japanese Application Serial No. 2003-018543.

Japanese Office Action dated Jul. 21, 2009 (2 pages), and English translation thereof (3 pages), issued in counterpart Japanese Application Serial No. 2003-018578.

Japanese Office Action dated Jan. 12, 2010 and English translation thereof issued in a counterpart Japanese Application No. 2003-018578.

SOLUTION SPRAY APPARATUS AND SOLUTION SPRAY METHOD

CROSS-REFERENCE TO RELATED APPLICATIONS

The present application is a Continuation application of U.S. application Ser. No. 11/048,509, filed Jan. 31, 2005 now U.S. Pat. No. 7,395,976, which is a Divisional application of U.S. application Ser. No. 10/763,613, filed Jan. 22, 2004, now U.S. Pat. No. 6,908,045, which is based upon and claims the benefit of priority from the prior Japanese Patent Applications No. 2003-018543, filed Jan. 28, 2003, and No. 2003-018578, filed Jan. 28, 2003, the entire contents of both of which are incorporated herein by reference.

BACKGROUND OF THE INVENTION

1. Field of the Invention

The present invention relates to a solution spray apparatus and solution spray method which spray a droplet or droplets onto a substrate.

2. Description of the Related Art

An organic EL (ElectroLuminescent) element is constituted by stacking an anode electrode, an organic EL layer which is formed from an organic material and emits light by internal flow of a current, and a cathode electrode. When a forward bias voltage exceeding a threshold is applied between the anode and cathode electrodes, the organic EL layer emits light. Such organic EL elements are arrayed as pixels in a matrix on a substrate to realize an organic EL display panel which displays an image by causing each organic EL element to emit light at a predetermined tonal luminance.

In an active matrix organic EL display panel formed by a plurality of pixels, one of the anode and cathode electrodes can be designed as a common electrode connected to all pixels. However, at least the other electrode and the organic EL layer must be patterned for each pixel. A method of patterning an electrode for each pixel can adopt a conventional semiconductor device manufacturing technique. More specifically, an electrode can be patterned for each pixel by properly performing the film formation step of an electrode material film by PVD, CVD, or the like, the mask step by photolithography or the like, and the shaping step of the electrode material film by etching or the like.

Organic EL layer formation methods can be roughly classified into dry vapor deposition and wet coating in accordance with conditions such as the material. In dry vapor deposition, a hard mask having an opening in a region where an organic EL layer is to be formed is interposed between a substrate and a vapor deposition source formed from an organic EL layer material. The organic EL layer material which is heated and vaporized is applied into a film in the target region on the substrate. In wet coating, an organic EL layer can be patterned for each pixel by applying an ink-jet technique, as disclosed in Jpn. Pat. Appln. KOKAI Publication No. 2000-106278. That is, droplets of an EL solution prepared by dissolving as a solute a polymer organic EL material for an organic EL layer in a solvent are sprayed from a nozzle, and an organic EL layer is patterned for each pixel. In wet coating to which the ink-jet technique is applied, the film formation step and the patterning step for each pixel can be almost simultaneously performed. An organic EL layer need not be etched and patterned using a photoresist mask.

In order to provide an organic EL display panel which displays a high-resolution image, the organic EL layer must be micropatterned. The ink-jet method can micropattern an organic EL layer because the droplet diameter of the EL solution is very small. However, droplets run and spread till solidification after landing, and droplets of organic EL layers in adjacent pixels may mix. To prevent this, a matrix-like partition which isolates each pixel from the surrounding pixels is used. A droplet which lands in a region surrounded by the partition is stopped by the partition, preventing mixture of droplets in adjacent pixels. Particularly when the emission color is different between adjacent pixels, organic EL layer materials which are different in accordance with the emission color hardly mix. The color purity of the emission color is expected to improve.

The polymer organic EL material generally has a low solubility in the solvent. The use of a solvent the solubility of which is low, requires a large amount of solvent in order to fully dissolve the solute. The time taken to evaporate the solvent after droplets of the EL solution land is long, resulting in low productivity. In order to form an organic EL layer into a film thickness suitable for emission, spraying of droplets of a low-concentration EL solution from an ink-jet nozzle and evaporation of droplets after landing on a substrate must be repeated a plurality of number of times, also resulting in low productivity. If the droplet amount sprayed at once is increased to decrease the count of the droplet spray step, a droplet readily overflows over the partition. Droplets in adjacent pixels mix to degrade the image quality. If the partition is formed high so as to prevent overflow of droplets, film formation of the partition takes a long time, and an electrode formed on the organic EL layer may be cut off by the partition step.

As a solvent which easily dissolves the polymer organic EL material, an organic solvent such as xylene is sometimes employed. However, such organic solvent exhibits high volatility; it vaporizes in an ink-jet nozzle, and the polymer organic EL material segregates to clog the ink-jet nozzle.

It is therefore an object of the present invention to efficiently deposit a solution at only a target position with high precision.

BRIEF SUMMARY OF THE INVENTION

According to one aspect of the present invention, as shown in, e.g., FIG. 2, a solution spray apparatus comprises a nozzle or nozzles (e.g., nozzle 55) which sprays one or more droplets of a solution, and a heater (e.g., nozzle heat-insulating unit 59) which heats the solution in the nozzle to a temperature lower than a boiling point of the solution in the nozzle.

According to the present invention, the solution in the nozzle is heated by the heater, so that a liquid component contained in a droplet sprayed from one or more spray ports of the nozzle easily evaporates. In particular, during flying of a droplet till landing onto a desired region or regions after spraying from the spray port or ports, the liquid component such as the solvent of the droplet gradually evaporates. The droplet lands with a small droplet volume and high solute concentration. The time until the solvent completely evaporates after the droplet lands is short.

Since a droplet becomes small by heat during flying, no landed droplet runs off from a desired position. When different droplets are applied onto desired adjacent regions, no solutions in the adjacent regions mix. A larger-volume droplet of even a solvent the solubility of which is low, can be sprayed at once. The spray count necessary to form the solute to a proper film thickness in a desired region can be decreased.

Since the solution is heated, the solubility in the solvent can be increased to prevent segregation of the solute in the nozzle including the spray port. This prevents nozzle clogging, and makes the film thickness by droplets uniform because of a uniform droplet concentration.

The heater heats the solution in the nozzle to a temperature lower than the boiling point of the solution in the nozzle. Generation of bubbles by volatilization of the solution in the nozzle can be suppressed. As a result, leakage of the solution from the spray port upon a change in solution pressure in the nozzle caused by bubbles can be suppressed. In a solution spray apparatus such as a piezoelectric solution spray apparatus which sprays a solution by a pressure increase in the nozzle caused by mechanical displacement of a piezoelectric element, bubbles in the nozzle change in volume in accordance with mechanical displacement of the piezoelectric element, inhibiting a pressure increase. The internal pressure of the nozzle does not increase, and clogging occurs in solution spraying. To prevent this, the heater heats the solution so as to suppress generation of bubbles, and a desired amount of solution can be sprayed.

The solution spray apparatus may adopt relative movement means (e.g., head 54, work table 51, or driving device 52) for moving one of the nozzle and substrate relatively to the other.

The solution spray apparatus can further manage the temperature by further comprising
measurement means for measuring a temperature of the solution in the nozzle, and
temperature control means (e.g., temperature controller 61) for controlling the heater so as to keep the temperature of the solution in the nozzle constant on the basis of the temperature measured by the measurement means. The temperature can be managed at high precision, and a droplet can be properly sprayed.

According to another aspect of the present invention, as shown in, e.g., FIG. 3,
another solution spray apparatus comprises
a nozzle or nozzles (e.g., nozzle 55) which sprays one or more droplets of a solution,
a tank (e.g., organic material solution tank 56) which stores the solution and supplies the solution to the nozzle, and
a heat-insulating unit (e.g., heat-insulating unit 58) which heat-insulates the solution in the tank.

According to the present invention, the solution in the tank is heat-insulated by the heat-insulating unit, the heat-insulated solution is supplied to the nozzle, and a droplet or droplets are sprayed from a spray port or ports of the nozzle. Since the solution is heat-insulated, the solvent contained in the droplet easily evaporates. In particular, during flying of a droplet till landing onto a desired region after being sprayed from the spray port, the solvent of the droplet gradually evaporates. The droplet lands on a desired region with a small droplet volume and high solute concentration. The time until the solvent completely evaporates after the droplet lands may be short.

Since a droplet becomes small by heat during flying, no landed droplet runs off from a desired region, and no solutions in desired adjacent regions mix. Thus, a larger-volume droplet of even a solvent the solubility of which is low, can be sprayed at once. The spray count necessary to form the solute to a proper film thickness in a desired region can be decreased.

Since the solution is heat-insulated, the solubility in the solvent can be increased to prevent deposition of the solute in the spray port or nozzle. This prevents nozzle clogging, and makes the film thickness by droplets uniform because of a uniform droplet concentration.

The heat-insulating unit preferably heat-insulates the solution in the tank so as to be lower than the boiling point of the solution in the tank.

The solution spray apparatus can further manage the temperature at high precision by further comprising measurement means for measuring a temperature of the solution in the tank, and temperature control means for controlling the heat-insulating unit so as to keep the temperature of the solution in the tank constant on the basis of the temperature measured by the measurement means.

According to still another aspect of the present invention, as shown in, e.g., FIG. 5,
a solution spray apparatus comprises
a table (e.g., work table 51) which supports a substrate,
at least one nozzle (e.g., nozzle 55) which ejects one or more droplets of a solution onto one surface of the substrate, and
a heat-insulating unit (substrate heat-insulating unit 63) which heat-insulates the table.

According to the present invention, the substrate is heat-insulated, and the temperature of an atmosphere from the nozzle or nozzle spray port to a desired region is increased and kept increased. The liquid contained in a droplet easily evaporates till landing onto a desired region by the effect of heat-insulating the solution in the nozzle in advance and the effect of heat-insulating a sprayed droplet during flying.

Since the solvent of the droplet that lands on the substrate quickly evaporates, no landed droplet runs off from a desired region, and no solutions in desired adjacent regions mix. A larger-volume droplet of even a solvent the solubility of which is low, can be sprayed at once. The spray count necessary to form the solute to a proper film thickness in a desired region can be decreased.

The solution spray apparatus may adopt relative movement means for moving one of the table and nozzle relatively to the other.

According to still another aspect of the present invention, as shown in, e.g., FIG. 7,
a solution spray apparatus comprises
a table (e.g., work table 51) which supports a substrate,
at lest one nozzle (e.g., nozzle 55) which sprays at least one droplet of a solution onto one surface of the substrate, and
a radiator (e.g., radial heat-insulating unit 64) which radiates heat toward a space between the nozzle and the substrate.

According to the present invention, heat is radiated to the space between the nozzle and the substrate, and the temperature of an atmosphere from the nozzle or nozzle spray port to a desired region is increased and kept increased. The solvent contained in a droplet easily evaporates till landing onto a desired region by the effect of heat-insulating the solution in the nozzle in advance and the effect of heat-insulating a sprayed droplet during flying. In particular, during flying of a droplet till landing onto a desired region after spraying from the spray port, the solvent of the droplet gradually evaporates. The droplet lands with a small droplet volume and high solute concentration. The time until the solvent completely evaporates after the droplet lands is short.

Since a droplet becomes small by heat during flying, no landed droplet runs off from a desired region, and no solutions in desired adjacent regions mix. For this reason, a larger-volume droplet of even a solvent of the solubility of which is low, can be sprayed at once. The spray count necessary to form the solute to a proper film thickness in a desired region can be decreased.

According to still another aspect of the present invention, as shown in, e.g., FIG. 9,
a solution spray apparatus comprises one or more nozzle (e.g., nozzle 55) which spray a droplet or droplets of a solution onto one surface of a substrate, a substrate heat-insulating unit (e.g., substrate heat-insulating unit 63) which heat-insulates the substrate, and cooling means (e.g., cooling medium jacket 69) for cooling the solution in the nozzle.

According to the present invention, the nozzle is cooled. Even in the use of a solution containing a low-boiling-point solvent or high-vapor-pressure solvent, a proper amount of solution can be sprayed while generation of a vaporized component in the solution stayed in the nozzle is suppressed. Since the substrate is heat-insulated, a droplet is quickly heated to dry the solvent in the solution until it reaches a desired region on the substrate. The droplet amount decreases to increase the solution viscosity. No droplet flows out and scatters from a desired region, and the time till evaporation can be shortened.

According to still another aspect of the present invention, as shown in, e.g., FIG. 9, a solution spray apparatus comprises at least one nozzle (e.g., nozzle 55) which sprays one or more droplet of a solution onto one surface of a substrate, and circulation means (e.g., cooling medium circulator 170) for circulating a medium controlled to a predetermined temperature around the nozzle in order to control the solution in the nozzle to a predetermined temperature.

According to this aspect, the temperature of the solution in the nozzle can be quickly, easily controlled to a predetermined temperature by circulating the medium.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

The first embodiment of the present invention will be described below with reference to several views of the accompanying drawing.

Figure 1A:
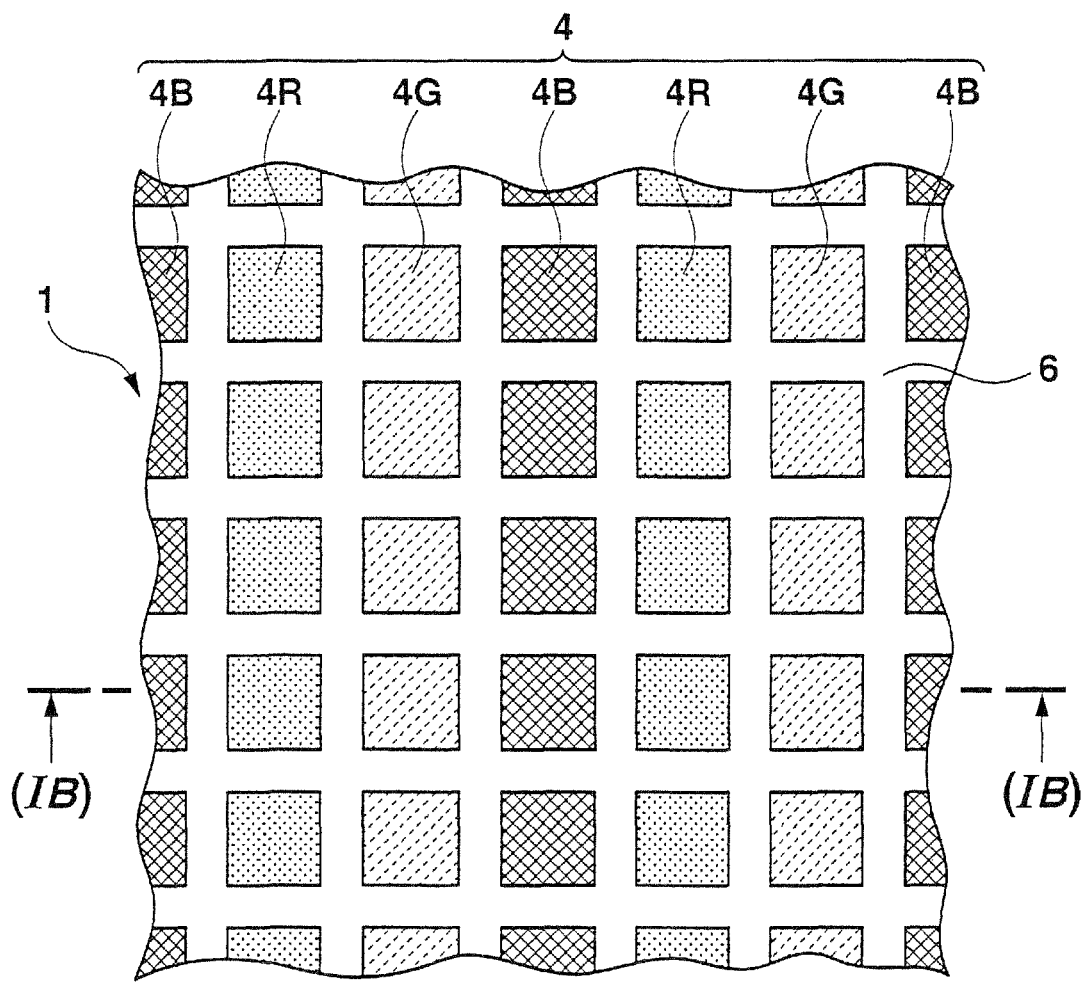
FIGS. 1A and 1B are a plan view and sectional view, respectively, showing an organic EL display panel.
Figure 1B:
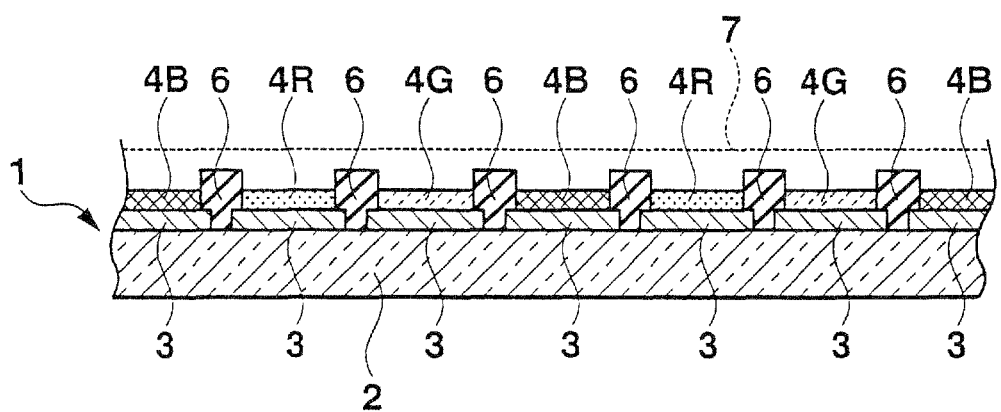

FIG. 1A is a plan view showing an organic EL display panel 1. FIG. 1B is a sectional view taken along the line (IB)-(IB) in FIG. 1A.

The organic EL display panel 1 comprises a transparent substrate 2 on which a plurality of pixels are formed. An organic EL element is formed in each pixel. An example of the transparent substrate 2 is a glass substrate such as a silica glass substrate or borosilicate glass substrate.

A plurality of transparent electrodes 3 are arrayed and formed in a matrix on one or upper surface of the transparent substrate 2. The transparent electrode 3 has a relatively high work function, and serves as the anode electrode of the organic EL element. The transparent electrode 3 is formed form a conductive, light-transmitting material. The transparent electrode 3 is formed from at least one material selected from the group consisting of, e.g., indium-tin-oxide (ITO), indium-zinc-oxide, indium oxide ($In_2O_3$), tin oxide ($SnO_2$), and zinc oxide (ZnO).

On the upper surface of the transparent substrate 2, is mounted a partition 6 which has a matrix shape obtained by coupling a plurality of walls along the row direction and a plurality of walls along the column direction at intersections. When viewed from the top, the partition 6 surrounds each transparent electrode 3 with its walls and partitions a pixel in each surrounded region. The partition 6 is formed from at least one insulating material selected from the group consisting of a photosensitive resin (e.g., polyimide resin), silicon oxide, and silicon nitride.

An organic EL layer 4 is formed on the transparent electrode 3 in each region surrounded by the walls of the partition 6. The organic EL layer 4 is the light-emitting layer of the organic EL element in a broad sense, and includes layers exhibiting electron injection, electron transportation, hole injection, and hole transportation. The organic EL layer 4 contains a light-emitting material (fluorescence) capable of wet film formation, such as a polymer organic compound (thiophene-based polymer, polyfluorene-based polymer, or the like). The organic EL layer 4 may have a three-layered structure of, sequentially from the transparent electrode 3, a hole transportation layer which transports holes upon application of a predetermined voltage, a light-emitting layer in a narrow sense which emits light upon injection of electrons and holes, and an electron transportation layer which transports electrons upon application of a predetermined voltage. Alternatively, the light-emitting layer may have a two-layered structure of, sequentially from the transparent electrode 3, a hole transportation layer and a light-emitting layer in a narrow sense. The light-emitting layer may have a one-layered structure of a light-emitting layer in a narrow sense. The light-emitting layer may have a multilayered structure in which an electron- or hole-injected layer is interposed between proper layers in each of the above layered structures. The light-emitting layer may have still another layered structure. The organic EL layer 4 has a function of transporting holes and electrons to a recombination region, and a function of generating excitons by recombination of holes and electrons in the recombination region to emit light. The organic EL layer 4 has any one of an organic EL layer 4R which is separated for each pixel and emits red light, an organic EL layer 4G which emits green light, and an organic EL layer 4B which emits blue light. As shown in FIG. 1A, a plurality of pixel lines on which the organic EL layers 4R are arranged, a plurality of pixel lines on which the organic EL layers 4G are arranged, and a plurality of pixel lines on which the organic EL layers 4B are arranged are repetitively arrayed sequentially from the left. These organic EL layers 4 are formed by a droplet spray or eject method using a solution spray or eject apparatus 50 (to be described later).

Although not shown in FIG. 1A, a counter electrode 7 is formed on the organic EL layers 4, as shown in FIG. 1B. The counter electrode 7 functions as a cathode electrode including a low-work-function layer which is arranged on a surface in contact with the organic EL layers 4 and formed from a material with a relatively low work function containing, e.g., indium, magnesium, calcium, lithium, barium, or a metal or alloy containing at least one of them, and a high-work-function layer which is arranged on the low-work-function layer and formed from aluminum, chromium, or the like. The counter electrode 7 may be formed as one electrode connected to all pixels, or as a plurality of electrodes electrically insulated for each pixel.

In each pixel, when a voltage is so applied as to set the potential of the transparent electrode 3 higher than that of the counter electrode 7, holes are injected from the transparent electrode 3 to the organic EL layer 4. At the same time, electrons are injected from the counter electrode 7 to the organic EL layer 4, and the organic EL layer 4 emits light.

If the organic EL display panel 1 is driven by an active matrix method, each pixel is provided with a pixel circuit which is connected to any one of a plurality of scanning lines (not shown) along the row direction in order to select a predetermined pixel during a selection period, and connected to any one of a plurality of data lines (not shown) along the column direction in order to supply a predetermined current to the organic EL layer 4 of the selected pixel. The pixel circuit includes pluralities of thin-film transistors and capacitors. During an emission period after the selection period, a predetermined current is supplied via the transparent electrode 3 to the organic EL layer 4 of a pixel selected in the selection period.

The solution spray apparatus 50 which forms the organic EL layer 4 by the droplet spray method will be explained.

Figure 2:
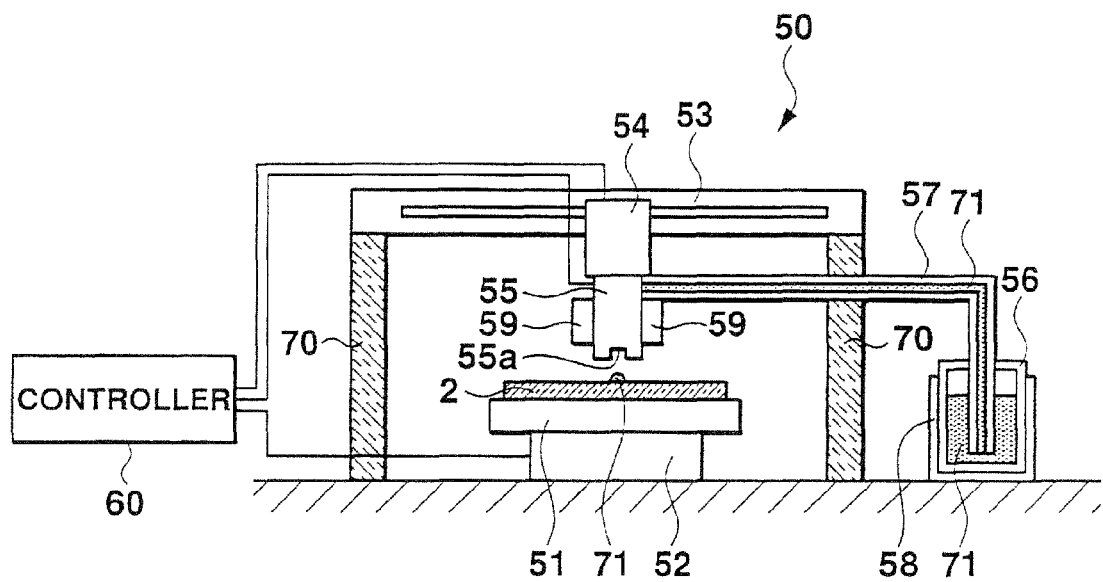
FIG. 2 is a schematic side view showing a solution spray apparatus according to the first embodiment of the present invention that is used to form the organic EL layer of the organic EL display panel.

FIG. 2 is a schematic side view showing the solution spray apparatus 50.

The solution spray apparatus 50 forms the organic EL layer 4 by spraying or ejecting droplets of an EL solution 71 onto the transparent substrate 2. One droplet sprayed to each region surrounded by the partition 6 is about 2 to 100 pl. The solute of the EL solution 71 is an organic material for the organic EL layer 4 (material capable of wet film formation containing at least any one of a light-emitting substance, hole transportation substance, and electron transportation substance). The solvent of the EL solution 71 is a material capable of dissolving the organic material of the organic EL layer 4. An example of this solvent is tetramethylbenzene with a boiling point higher than room temperature. A material having higher volatility enhances the effects of the present invention. In forming the organic EL layer 4, the transparent substrate 2 on which a plurality of transparent electrodes 3 and the partition 6 are formed in advance is used. In FIG. 2, the partition 6 and transparent electrodes 3 on the transparent substrate 2 are not illustrated.

The solution spray apparatus 50 comprises a work table 51, a driving device 52, a guide 53, a head 54, a nozzle 55, an organic material solution tank 56, an EL solution supply pipe 57, a first heat-insulating unit 58, a second heat-insulating unit 59, and a controller 60. The work table 51 has a flat, horizontal upper surface and is movable in the sub-scanning direction (direction perpendicular to the sheet surface). The driving device 52 moves the work table 51 in the sub-scanning direction. The guide 53 extends in the main scanning direction (direction parallel to the sheet surface) substantially perpendicular to the sub-scanning direction. The head 54 is a moving member which is guided by the guide 53 and moves in the main scanning direction along the guide 53. The nozzle 55 has one or more ports to spray a droplet or droplets of the EL solution 71 toward the substrate 2. The organic material solution tank 56 serves as the supply source of the EL solution 71. The EL solution supply pipe 57 supplies the EL solution 71 from the organic material solution tank 56 to the nozzle 55. The first heat-insulating unit 58 is arranged around the organic material solution tank 56, and has a heating resistor which heats the EL solution 71 in the organic material solution tank 56 to 30° C. or more by an electrical signal. The second heat-insulating unit 59 is arranged around the nozzle 55, and has a heating resistor which heats the EL solution 71 in the nozzle 55 to 30° C. or more by an electrical signal. The controller 60 controls the whole solution spray apparatus 50.

The work table 51 is flat, and the transparent substrate 2 having the transparent electrodes 3 and partition 6 provided thereon is set on the upper surface of the work table 51.

The organic material solution tank 56 stores the EL solution 71, and has the first heat-insulating unit 58. The first heat-insulating unit 58 desirably heats the EL solution 71 stored in the organic material solution tank 56 to a temperature higher than room temperature so as not to boil the EL solution 71 stored in the organic material solution tank 56. Since the EL solution 71 is sealed in the organic material solution tank 56, the organic material solution tank 56 prevents a change in the concentration of the EL solution 71 in the organic material solution tank 56 caused by volatilization of the solvent in the EL solution 71. The organic material solution tank 56 also prevents mixture of external dust into the EL solution 71 in the tank 56.

The driving device 52 conveys the work table 51 together with the transparent substrate 2 in the sub-scanning direction in synchronism with the operation of the head 54. More specifically, the driving device 52 intermittently conveys the transparent substrate 2. The driving device 52 is controlled by the controller 60.

The head 54 reciprocates in the main scanning direction along the guide 53 above the work table 51 in synchronism with intermittent conveyance of the transparent substrate 2. More specifically, while the transparent substrate 2 stops, the head 54 reciprocates at least once in the main scanning direction. The driving of head 54 is controlled by the controller 60.

The nozzle 55 is arranged at the lower portion of the head 54. The nozzle 55 communicate with the organic material solution tank 56 via the EL solution supply pipe 57. The EL solution 71 is supplied from the organic material solution tank 56 to the nozzle 55 via the EL solution supply pipe 57, and filled in the nozzle 55. One or a plurality of spray ports 55a are arranged at the lower end of the nozzle 55, and the nozzle 55 has a spray means. The nozzle 55 sprays droplets of the EL solution 71 from the spray port or ports 55a toward the transparent substrate 2 by the operation of the spray means. The distance from the spray port 55a to the transparent substrate 2 is desirably short for the precision of the droplet landing position on the transparent substrate 2. However, the distance is preferably long to a certain degree in order to suppress splash of droplets landed on the transparent substrate 2 to the nozzle 55. Considering these two conditions, the distance is preferably about 1.0 mm to 1.5 mm. The time until the droplet of the EL solution 71 are sprayed from the spray port 55a and reach the transparent substrate 2 is preferably 1 to 100 msec.

The spray means arranged in the nozzle 55 may be a piezoelectric means, electrostatic means, thermal jet means, or the like. The piezoelectric spray means changes the volume of a piezoelectric element to increase the internal pressure of the nozzle 55, and thus sprays a droplet of the EL solution 71 from the spray port 55a. The electrostatic spray means applies a voltage to a capacitor in contact with the EL solution 71 in the nozzle 55, changes the attraction or repulsion of the capacitor electrode, increases the pressure of the solution in the nozzle 55, and sprays a droplet of the EL solution 71 from the spray port 55a. The thermal jet spray means instantaneously film-boils, by a heating member, the EL solution 71 in the nozzle 55 in contact with the heating member, generates bubbles in the EL solution 71, increases the internal pressure of the nozzle 55, and sprays a droplet of the EL solution 71 from the spray port 55a.

Either the transparent substrate 2 or nozzles 55 is relatively moved along a plane parallel to the upper surface of the work table 51 by the work table 51, driving device 52, and head 54.

The nozzle 55 has the second or nozzle heat-insulating unit (heat keeping unit) 59. The second heat-insulating unit 59 compensates for a heat amount deprived when the EL solution 71 passes through the EL solution supply pipe 57 and the like. The second thermal insulator 59 heats the EL solution 71 in the nozzle 55 to a temperature of 30° C. or more so as not to boil the EL solution 71 in the nozzle 55. The second heat-insulating unit 59 is different from a thermal jet heating member. More specifically, the thermal jet heating member instantaneously heats the EL solution 71 to film-boil the EL solution 71 only when the EL solution 71 is sprayed. To the contrary, the second heat-insulating unit 59 heats the entire EL solution 71 in the nozzle 55 so as not to boil the EL solution 71. Further, the driving temperature keeps a steady state.

An organic material for the organic EL layer 4, in the EL solution 71 changes depending on the emission color, and organic EL layers 4 of a plurality of organic materials are formed from corresponding nozzles 55 for corresponding pixels at once. In this case, EL solutions 71 containing these organic materials are stored in different organic material solution tanks 56, and a plurality of nozzles 55 coupled to the respective organic material solution tanks 56 are arranged. For example, an EL solution 71 for the organic EL layer 4R which emits red light is stored in a red organic material solution tank 56 while being heated by a first red heat-insulating or heat-keeping unit 58 so as not to boil. The EL solution 71 reaches a red nozzle 55 heated by a second red heat-insulating unit 59 via a red EL solution supply pipe 57.

An EL solution 71 for the organic EL layer 4G which emits green light is stored in a green organic material solution tank 56 while being heated by a first green heat-insulating unit 58 so as not to boil. The EL solution 71 reaches a green nozzle 55 heated by a second green heat-insulating unit 59 via a green EL solution supply pipe 57. An EL solution 71 for the organic EL layer 4B which emits blue light is stored in a blue organic material solution tank 56 while being heated by a first blue heat-insulating unit 58 so as not to boil. The EL solution 71 reaches a blue nozzle 55 heated by a second blue heat-insulating unit 59 via a blue EL solution supply pipe 57.

At this time, the first, red, green, and blue heat-insulating units 58 may be set to different heating temperatures as far as the units 58 are heated enough to dissolve corresponding organic materials in solvents without boiling in accordance with the properties of the organic materials. The second, red, green, and blue heat-insulating units 59 may be set to different heating temperatures as far as they are heated enough to dissolve corresponding organic materials in solvents without boiling in accordance with the properties of the organic materials.

The above-described work table 51 and nozzle (nozzles) 55 are incorporated in a housing 70. Sub-scanning movement of the transparent substrate 2, spraying of droplets of the EL solution 71 from the nozzle 55, and landing of droplets of the EL solution 71 on the transparent substrate 2 are performed in the internal space of the housing 70.

The controller 60 controls the driving device 52, head 54, and nozzle (or nozzles) 55 to operate or stop them at predetermined timings.

A method of manufacturing the organic EL display panel 1 will be explained.

A plurality of transparent electrodes 3 are patterned into a matrix on a transparent substrate 2 by properly performing a film formation step by PVD, CVD, or the like, a mask step by photolithography or the like, and a thin-film shaping step by etching or the like.

A resist film of a photosensitive resin such as polyimide is formed on one surface of the transparent substrate 2 having the transparent electrodes 3 by spin coating, dipping, or the like. The resist film is exposed and partially removed with a developing solution, thereby shaping the resist film so as to surround each transparent electrode 3. The remaining resist film serves as the partition 6. The partition 6 of silicon oxide or silicon nitride may be formed by properly performing a film formation step by PVD, CVD, or the like, a mask step by photolithography or the like, and a thin-film shaping step by etching or the like.

The transparent substrate 2 having the transparent electrodes 3 and partition 6 is set on the work table 51. The solution spray apparatus 50 is used to eject a droplet of the EL solution 71 to each region surrounded by the walls of the partition 6, thereby forming an organic EL layer 4 in each region surrounded by the partition 6.

More specifically, each unit of the solution spray apparatus 50 is controlled by the controller 60 and operates as follows.

The driving device 52 intermittently conveys the transparent substrate 2 together with the work table 51 in the sub-scanning direction. While the transparent substrate 2 stops, the head 54 reciprocates at least once in the main scanning direction.

While the head 54 moves in the main scanning direction, the nozzle 55 passes immediately above the transparent electrode 3 of each pixel surrounded by the partition 6. While the nozzle 55 passes above the transparent electrode 3, the nozzle 55 sprays one or a plurality of droplets of the EL solution 71 toward the transparent electrode 3 of each pixel. Note that the head 54 may be so moved as to position the nozzle port to a predetermined position of the transparent electrode 3 and then temporarily stopped. The nozzle 55 may spray one or a plurality of droplets of the EL solution 71 through its port, toward the transparent electrode 3. This operation may be repeated to sequentially form the organic EL layers 4 on the transparent electrodes 3.

A droplet that lands on the transparent electrode 3 spreads into a film and solidifies to form an organic EL layer 4.

After the head 54 reciprocates at least once in the main scanning direction, as described above, the driving device 52 conveys the transparent substrate 2 together with the work table 51 by a predetermined distance in the sub-scanning direction. After the transparent substrate 2 stops again, reciprocation of the head 54 and spraying of the EL solution 71 from the nozzle 55 are executed again. The solution spray apparatus 50 repeats the above-mentioned operation to form organic EL layers 4 in all regions surrounded by the walls of the partition 6.

While the solution spray apparatus 50 operates, the first heat-insulating unit 58 heats the EL solution 71 in the organic material solution tank 56 so as not to boil the EL solution 71, and the second heat-insulating unit 59 heats the EL solution 71 in the nozzle 55 so as not to boil the EL solution 71. During flying of a droplet of the EL solution 71 till landing onto the transparent electrode 3 after spraying from the spray port 55a, the solvent in the droplet evaporates to gradually decrease the droplet volume. When the droplet lands, the volume becomes small to suppress splash of the landed droplet. Thus, no droplet runs off from a region surrounded by the partition 6.

Since the EL solution 71 is heated in the nozzle 55, the solubility in the solvent increases to increase the concentration of the organic material. This can thicken the organic EL layer 4 formed by one droplet spray from the port. The droplet spray count for forming the organic EL layer 4 having a predetermined thickness can be decreased to shorten the manufacturing time of the overall organic EL display panel 1.

Since a heated droplet of the heated EL solution 71 is sprayed, the solvent in the droplet quickly evaporates by heat during flying before the droplet lands. The time taken for evaporation after landing can also be shortened to shorten the manufacturing time of the overall organic EL display panel 1.

Since the EL solution 71 is heated, the solubility in the solvent is increased. The organic material hardly deposits in the spray port or ports 55a, preventing clogging of the spray port 55a.

Since the first and second heat-insulating units 58 and 59 heat the EL solution 71 so as not to boil it, the pressure of the EL solution 71 in the nozzle 55 or organic material solution tank 56 does not abruptly change. A droplet from the spray port 55a of the nozzle 55 does not land at a position different from a desired one, such as a position immediately above the partition 6.

In this manner, the organic EL layer 4 is formed in each surrounded region. When the organic EL layer 4 has a multilayered structure of, e.g., a hole transportation layer, a light-emitting layer in a narrow sense, and an electron transportation layer, the solution spray apparatus 50 is prepared for each layer. These layers are sequentially formed by the above-described way, thereby forming the organic EL layers 4.

After the end of forming the organic EL layers 4 by the solution spray apparatus 50, a film formation step by PVD, CVD, or the like is performed to form a counter electrode 7 on one surface of the transparent substrate 2 on which the organic EL layers 4 are formed.

Since the first embodiment sprays a heated droplet, no droplet runs off, and no EL solutions 71 in two adjacent pixels mix on the partition 6. The droplet volume which can be sprayed at once can be increased to decrease the spray count necessary to form the organic EL layer 4 having a predetermined thickness.

Second Embodiment

Figure 3:
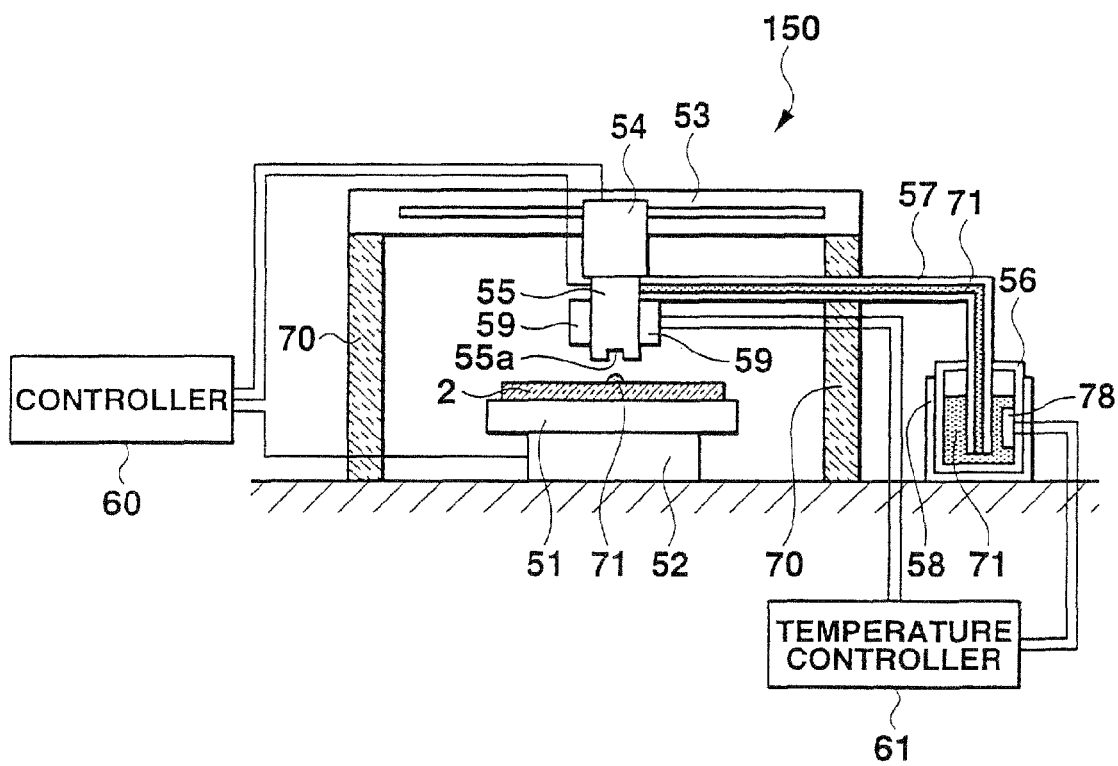
FIG. 3 is a schematic side view showing a solution spray apparatus according to the second embodiment of the present invention.

A solution spray apparatus 150 as shown in FIG. 3 may be used as an apparatus which forms an organic EL layer 4. The same reference numerals as those of the building components of the solution spray apparatus 50 denote the same building components of the solution spray apparatus 150, and a detailed description thereof will be omitted.

The solution spray apparatus 150 comprises a temperature controller 61 in addition to the arrangement of the solution spray apparatus 50 shown in FIG. 2. The temperature controller 61 controls heating by first and second heat-insulating units 58 and 59. More specifically, an organic material solution tank 56 incorporates a temperature measurement unit (thermometer) 78 which measures the temperature of an EL solution 71. The measured temperature is fed back from the temperature measurement unit 78 to the temperature controller 61. The temperature controller 61 controls the first heat-insulating unit 58 so as to keep the EL solution 71 in the organic material solution tank 56 constant on the basis of the measured temperature. Similarly, nozzle 55 incorporates a temperature measurement unit 78 which measures the temperature of the EL solution 71. The measured temperature is fed back from the temperature measurement unit 78 to the temperature controller 61. The temperature controller 61 controls the second heat-insulating unit 59 so as to keep the temperature of the EL solution 71 in the nozzle 55 constant on the basis of the measured temperature. By controlling the first and second heat-insulating units 58 and 59 by the temperature controller 61, the EL solution 71 is kept heated at a predetermined temperature so as not to boil.

In the solution spray apparatus 150, the temperature of the EL solution 71 in the nozzle 55 and organic material solution tank 56 is controlled constant, and the EL solution 71 does not boil. The pressure of the EL solution 71 is stable, and sprayed droplets always have the same solubility and temperature. Sprayed droplets always have the same concentration and amount and take the same evaporation time, and thus the film thicknesses of formed organic EL layers 4 become uniform.

Third Embodiment

Figure 4:
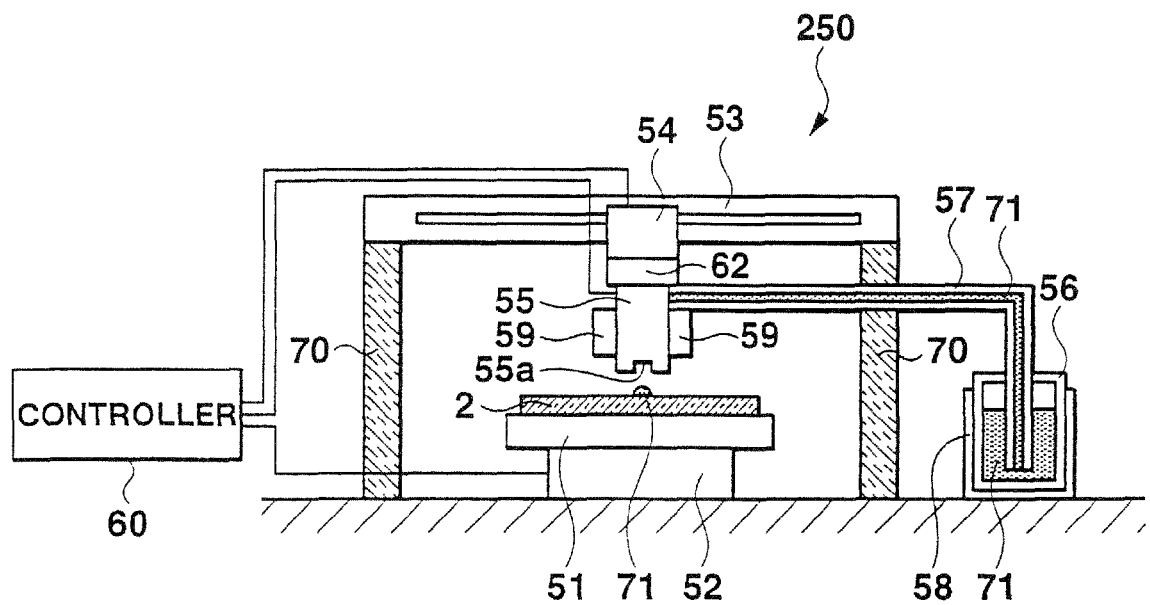
FIG. 4 is a schematic side view showing a solution spray apparatus according to the third embodiment of the present invention.

A solution spray apparatus 250 as shown in FIG. 4 may be used as an apparatus which forms an organic EL layer 4. The same reference numerals as those of the building components of the solution spray apparatus 50 denote the same building components of the solution spray apparatus 250, and a detailed description thereof will be omitted.

The solution spray apparatus 150 comprises a heat insulator 62 in addition to the arrangement of the solution spray apparatus 50 shown in FIG. 2. The heat insulator 62 is interposed between a head 54 and nozzle or nozzles 55 so as to be sandwiched between them. The heat insulator 62 prevents conduction of the heat of the nozzle 55 heated by first and second heat-insulating units 58 and 59 to the head 54. If the head 54 is heated, it expands and cannot be positioned at high precision, and the droplet landing position may deviate. However, in the solution spray apparatus 250, the heat insulator 62 suppresses heating of the head 54, and no sprayed droplet causes any landing error on a partition 6.

In the solution spray apparatus 250, the head 54 may be arranged movably not only in the main scanning direction but also in the sub-scanning direction. At this time, a work table 51 may or may not move in the sub-scanning direction.

Fourth Embodiment

Figure 5:
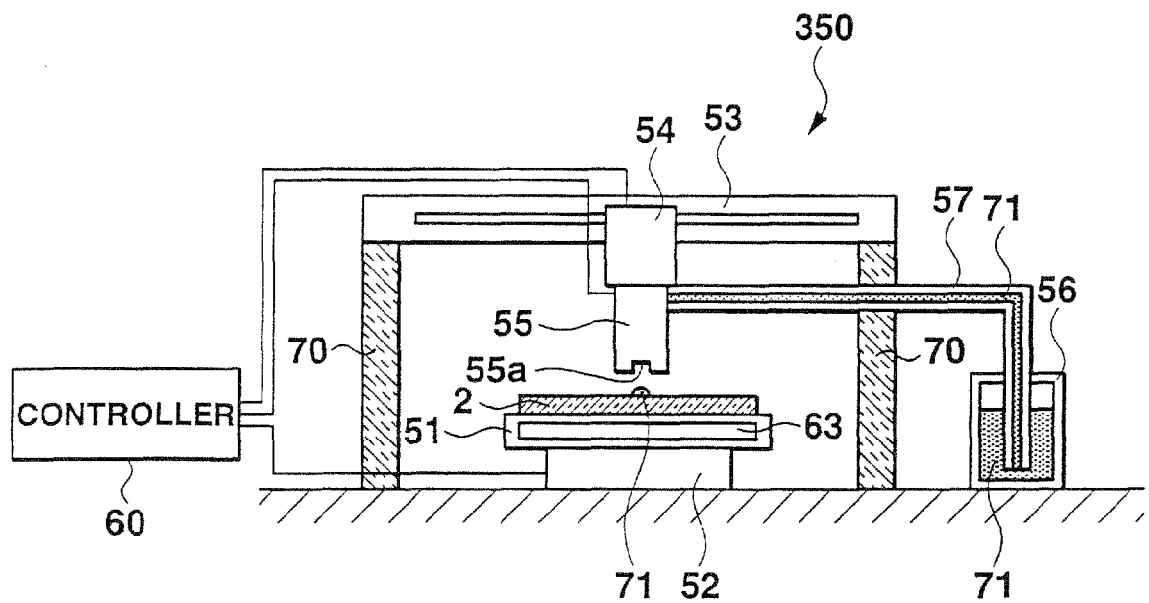
FIG. 5 is a schematic side view showing a solution spray apparatus according to the fourth embodiment of the present invention.

A solution spray apparatus 350 as shown in FIG. 5 may be used as an apparatus which forms an organic EL layer 4. The same reference numerals as those of the building components of the solution spray apparatus 50 denote the same building components of the solution spray apparatus 350, and a detailed description thereof will be omitted.

Instead of the first and second heat-insulating units 58 and 59 of the solution spray apparatus 50 shown in FIG. 2, the solution spray apparatus 350 comprises a substrate heat-insulating unit 63 having a heating resistor which heats upon supply of an electrical signal. The remaining building components are the same as those of the solution spray apparatus 50. The substrate heat-insulating unit 63 is buried in a work table 51, and heats a transparent substrate 2 from the work table 51. By heating the transparent substrate 2 by the substrate heat-insulating unit 63, heat is transferred to nozzle 5S to heat the solution therein. The solvent in droplets heated in the nozzle 55 easily vaporizes immediately after spraying. The atmosphere above the transparent substrate 2 is also heated by the substrate heat-insulating unit 63. A droplet sprayed from a spray port 55a is heated till landing onto the transparent substrate 2, and the solvent more easily vaporizes. The droplet diameter can be decreased without decreasing the organic material amount in the droplet, and a droplet can be prevented from splashing from a landed pixel to an adjacent pixel over a partition 6. The transparent substrate 2 is also heated by the substrate heat-insulating unit 63, and the solvent can be evaporated immediately after a droplet of an EL solution 71 lands, shortening the drying time and increasing the productivity.

Fifth Embodiment

Figure 6:
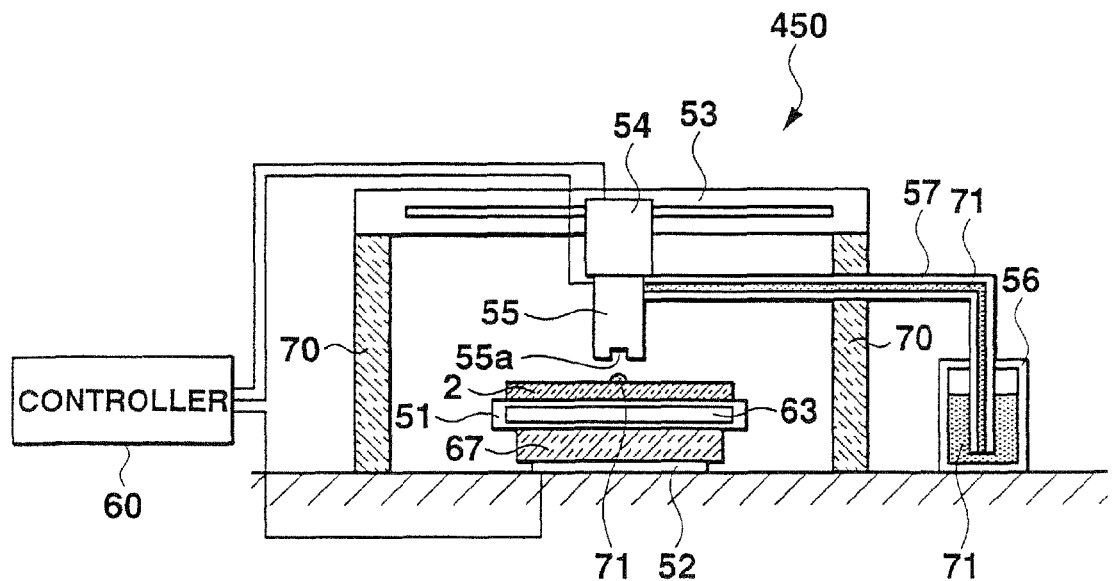
FIG. 6 is a schematic side view showing a solution spray apparatus according to the fifth embodiment of the present invention.

A solution spray apparatus 450 as shown in FIG. 6 may be used as an apparatus which forms an organic EL layer 4. The same reference numerals as those of the building components of the solution spray apparatus 50 denote the same building components of the solution spray apparatus 450, and a detailed description thereof will be omitted.

The solution spray apparatus 450 comprises a heat insulator 67 in addition to the arrangement of the solution spray apparatus 350 shown in FIG. 5. The heat insulator 67 is interposed between a work table 51 and a driving device 52. The heat insulator 67 prevents conduction of the heat of the work table 51 heated by a substrate heat-insulating unit 63 to the driving device 52. If the driving device 52 overheats, it thermally expands. If a controller 60 moves the work table 51 in the sub-scanning direction and a head 54 in the main scanning direction on the basis of moving amounts programmed in advance, misalignment occurs to shift the droplet landing position. In the solution spray apparatus 450, however, the heat insulator 67 suppresses heating of the driving device 52, no heat is transferred below the heat insulator 67, and the driving device 52 does not thermally expand. A transparent substrate 2 is formed from glass, has low heat absorption, and hardly thermally expands, preventing any droplet landing error. In this structure, the work table 51 may be arranged movably not only in the sub-scanning direction but also in the main scanning direction. At this time, the head 54 may or may not move in the main scanning direction.

Sixth Embodiment

Figure 7:
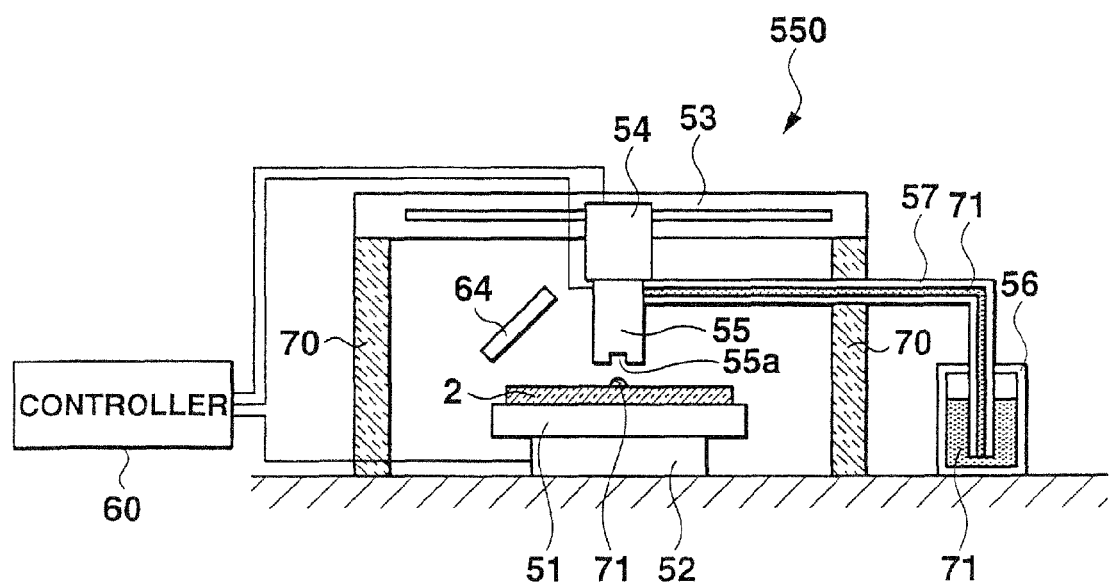
FIG. 7 is a schematic side view showing a solution spray apparatus according to the sixth embodiment of the present invention.

A solution spray apparatus 550 as shown in FIG. 7 may be used as an apparatus which forms an organic EL layer 4.

Instead of the first and second heat-insulating units 58 and 59 of the solution spray apparatus 50 shown in FIG. 2, the solution spray apparatus 550 comprises a radial heater 64 which heats upon supply of an electrical signal. The radial heater 64 is arranged above a work table 51 inside a housing 70 at a position where the radial heater 64 does not interfere with movement of a head 54 and nozzle 55. The radial heater 64 radially dissipates heat toward the space between the nozzle 55 and a transparent substrate 2 to heat droplets sprayed from a spray port 55a. Also in the solution spray apparatus 550, a droplet is heated during flying, and the solvent in the droplet evaporates. No landed droplet runs off from a region surrounded by a partition 6, and no EL solutions 71 in two adjacent pixels mix on the partition 6. In order to maintain high-precision position landing of a droplet, a heater such as an infrared heater (e.g., the radial heater 64) which transfers heat without any wind is preferable.

Seventh Embodiment

Figure 8:
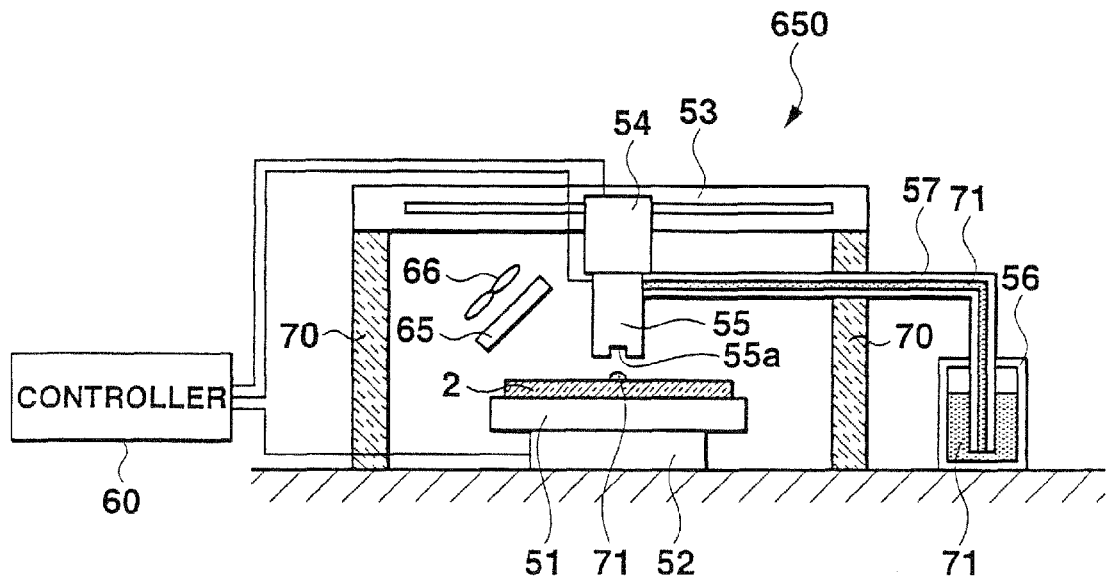
FIG. 8 is a schematic side view showing a solution spray apparatus according to the seventh embodiment of the present invention.

A solution spray apparatus 650 as shown in FIG. 8 may be used as an apparatus which forms an organic EL layer 4.

Instead of the radial heater 64 of the solution spray apparatus 550 shown in FIG. 7, the solution spray apparatus 650 comprises a fan 66 and a heating unit 65 having a heating resistor which heats upon supply of an electrical signal. The heating unit 65 and fan 66 are arranged above a work table 51 inside a housing 70 at a position where they do not interfere with movement of a head 54 and nozzle 55. The heating unit 65 generates heat, and the fan 66 fans hot air from the heating unit 65 to the space between the work table 51 and the nozzle 55. The heat of the heating unit 65 is radiated by the fan 66 to the space between the nozzles 55 and a transparent substrate 2 to heat a droplet sprayed from a spray port 55a. Also in the solution spray apparatus 650, a droplet is heated during flying, and the solvent in the droplet evaporates. No landed droplet runs off from a region surrounded by a partition 6, and no EL solutions 71 of two adjacent pixels mix on the partition 6.

Eighth Embodiment

Figure 9:
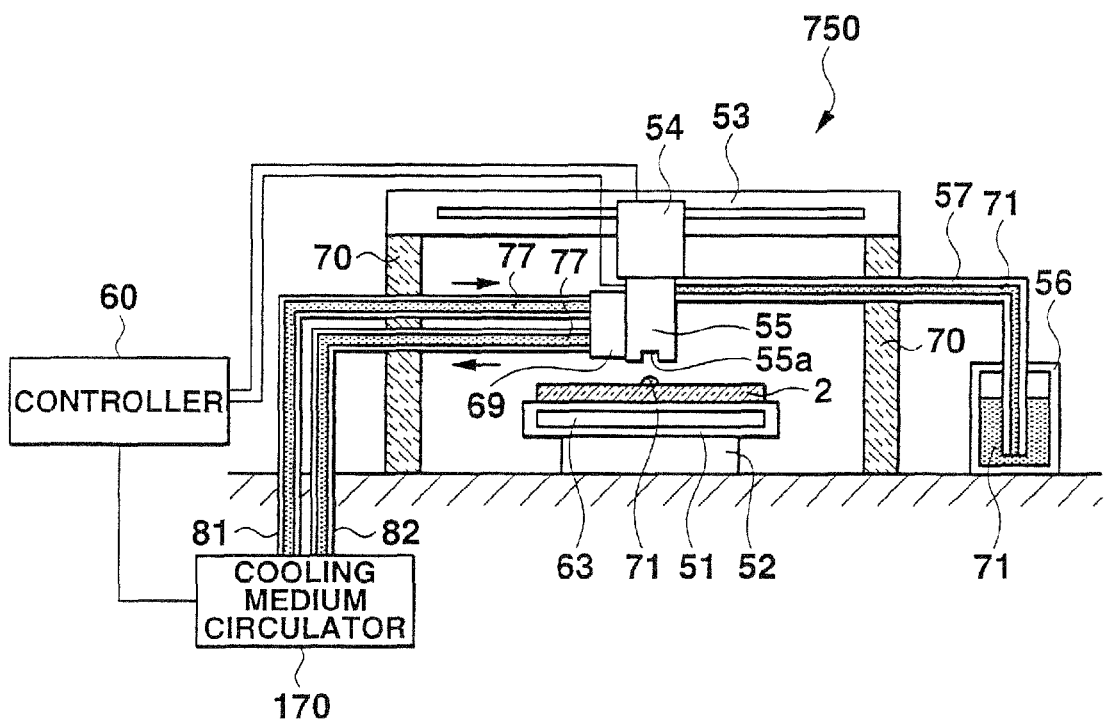
FIG. 9 is a schematic side view showing a solution spray apparatus according to the eighth embodiment of the present invention.

A solution spray apparatus 750 according to the eighth embodiment of the present invention will be described. FIG. 9 is a schematic side view showing the solution spray apparatus 750 according to the eighth embodiment.

The solution spray apparatus 750 comprises a work table 51, a driving device 52, a guide 53, a head 54, at least one nozzle 55, an organic material solution tank 56, an EL solution supply pipe 57, a substrate heat-insulating unit 63, a cooling medium jacket 69, a cooling medium circulator 170, a cooling medium supply pipe 81, a cooling medium discharge pipe 82, and a controller 60. The work table 51 has a flat, horizontal upper surface and is movable in the sub-scanning direction. The driving device 52 drives the work table 51 so as to move the work table 51 in the sub-scanning direction. The guide 53 extends in the main scanning direction substantially perpendicular to the sub-scanning direction. The head 54 is a moving member which is guided by the guide 53 and moves in the main scanning direction along the guide 53. The nozzle 55 sprays an organic EL solution 71 as a droplet. The organic material solution tank 56 serves as the supply source of the organic EL solution 71. The EL solution supply pipe 57 supplies the organic EL solution 71 from the organic material solution tank 56. The substrate heat-insulating unit 63 heats a transparent substrate 2 on the work table 51. The cooling medium jacket 69 is arranged in direct or indirect contact with the nozzle 55, receives a cooled cooling medium 77, and cools the nozzle 55 by the temperature of the cooling medium 77. The cooling medium circulator 170 cools and circulates the cooling medium 77. The cooling medium supply pipe 81 supplies the cooling medium 77 supplied from the cooling medium circulator 170 to the cooling medium jacket 69. The cooling medium discharge pipe 82 supplies the cooling medium 77 discharged from the cooling medium jacket 69 to the cooling medium circulator 170. The controller 60 controls the whole solution spray apparatus 750. The cooling medium 77 may be a liquid such as a solution or pure water containing a coolant (e.g., alcohol, diethylene glycol, or potassium chloride) as far as the cooling medium 77 can be utilized as a fluid which can move through the cooling medium supply pipe 81 and cooling medium discharge pipe 82 and can be easily cooled. Also, the cooling medium 77 may be a cooled gas, or include a liquid crystal phase containing cooled crystallized solid particles.

The transparent substrate 2 and nozzle 55 are relatively moved along a plane parallel to the upper surface of the work table 51 by the work table 51, driving device 52, and head 54. FIG. 9 shows only one nozzle 55 and one organic material solution tank 56. In practice, a plurality of organic material solution tanks 56 are arranged, and a plurality of nozzles 55 are arranged in the head 54. More specifically, organic EL solutions 71 in each of which an organic material for emitting light in any one of red, green, and blue is dissolved are filled in corresponding organic material solution tanks 56. The nozzle 55 which communicates with each organic material solution tank 56 sprays the organic EL solution 71 in which the organic EL material for emitting light in any one of red, green, and blue is dissolved.

The cooling medium circulator 170 comprises a tank which stores the cooling medium 77, a cooler which cools the cooling medium 77 in the tank, a pump which pumps the cooling medium 77 of the tank, and a discharge means which discharges the cooling medium 77 to the tank. The cooling medium circulator 170 supplies the cooling medium 77 cooled in the tank to the cooling medium jacket 69 via the cooling medium supply pipe 81 by the pump. The cooling medium jacket 69 transfers cool air of the supplied cooling medium 77 to the nozzles 55 to deprive the nozzles 55 of heat and cool the nozzles 55. The cooling medium jacket 69 may be arranged on part of the surfaces of the nozzles 55, as shown in FIG. 9. Alternatively, the cooling medium jacket 69 may be so arranged as to surround the nozzles 55 in order to increase the cooling efficiency.

The cooling medium 77 which absorbs the heat of the nozzles 55 in the cooling medium jacket 69 is discharged to the cooling medium circulator 170 via the cooling medium discharge pipe 82. The cooling medium circulator 170 incorporates the cooler to cool the cooling medium. The cooling medium 77 can also be cooled by arranging in at least one of the cooling medium supply pipe 81 and cooling medium discharge pipe 82 a cooler which electrically cools the cooling medium. When the cooling medium circulator 170 does not incorporate any means for cooling a cooling medium supplied from the cooling medium discharge pipe 82, the cooling medium 77 which is supplied from the cooling medium jacket 69 and heated by the heat of the nozzles 55 may be discharged outside the solution spray apparatus 750. In this case, fresh cooled cooling medium 77 is externally received in accordance with the discharge amount of the cooling medium 77, and sent to the cooling medium supply pipe 81. In this structure, the nozzles 55 can be cooled without any cooling time of the heated cooling medium 77.

The controller 60 sets the temperature in the solution spray apparatus 750 to be lower than that of the organic EL solution 71 in the nozzles 55. As a result, the temperatures of the cooling medium supply pipe 81 and cooling medium discharge pipe 82 can be decreased to cool the cooling medium 77 in the pipes which moves in contact with the cooling medium supply pipe 81 and cooling medium discharge pipe 82.

A pattern is formed by spraying a droplet of the organic EL solution 71 in which the organic EL material is dissolved, from a spray port 55a to each of pixels formed by a partition 6 on the transparent substrate 2 and a transparent electrode 3, as shown in FIGS. 1A and 1B. In this case, if the solvent of the organic EL solution 71 has a low volatility or high boiling point, the organic EL solution 71 cannot be quickly dried. A solution droplet may exceed the partition 6 by the landing force on the transparent electrode 3, and flow out to an adjacent pixel.

To prevent this, the solution spray apparatus 750 uses the substrate heat-insulating unit 63 to heat, e.g., the work table 51 and the transparent substrate 2 set on the work table 51. Since the transparent substrate 2 and its upper atmosphere are heated, a droplet is heated immediately when it is sprayed from the spray port 55a of the nozzle 55. The solvent in the droplet evaporates or its evaporation is promoted before the droplet reaches a pixel. After landing, evaporation of the solvent in the heated droplet is promoted to quickly dry the droplet.

If, however, the temperature of the work table 51 is increased using an organic EL solution 71 containing a low-boiling-point solvent or high-vapor-pressure (high-volatility) solvent, radial heat is generated from the work table 51, and increases the nozzle 55 and its internal temperature. As a result, part of the organic EL solution 71 in the nozzle 55 vaporizes. When the nozzle 55 uses a piezoelectric spray means, a diaphragm is contracted and expanded by a piezoelectric element to spray the organic EL solution 71. When the diaphragm expands, the internal pressure decreases to more readily vaporize the organic EL solution 71.

If the vaporized solvent amount is small, the vaporized solvent gas dissolves in the solvent solution again without posing any problem. However, when a low-boiling-point solvent or high-vapor-pressure solvent is used and the ambient temperature in spraying solvent droplets is high (temperature in the nozzle 55 is high), the vaporized solvent amount is large, and the vaporized solvent gas hardly dissolves in the solvent again. For example, a PEDOT (PolyEthyleneDiOxyThiophene) solution is used as the organic EL solution 71 in forming the hole transportation layer of an organic EL layer 4. The PEDOT solution uses high-vapor-pressure water as a main solvent. If the temperature of the nozzle 55 exceeds 40° C., a gas is confirmed to be generated. The nozzle 55 is so set as to be filled with the solution and spray a predetermined amount (predetermined volume) of solution. If the vaporized solvent gas stays in the nozzle 55 and is mixed in the solution, the organic EL solution 71 cannot be sprayed by an accurate amount. In some cases, the solution cannot be sprayed at all. A solvent gas may be sprayed from the spray port 55a, similar to a liquid solution. However, the amount of the organic EL solution 71 per unit volume is much smaller than the amount of liquid solution, and no film can be satisfactorily formed. A sufficient amount of droplet does not reach the transparent electrode 3, and the film thickness of the organic EL layer 4 becomes small. The transparent electrode 3 and a counter electrode 7 are electrically short-circuited to decrease the yield of an organic EL display panel 1.

To prevent this, the solution spray apparatus 750 cools the organic EL solution 71 in the nozzles 55 by using the cooling medium jacket 69 arranged on the nozzle 55. This suppresses vaporization of the organic EL solution 71 and allows continuously spraying droplets of the organic EL solution 71 by an accurate amount from the nozzles 55.

A method of manufacturing the organic EL display panel 1 will be explained.

Similar to the first embodiment, a transparent substrate 2 having transparent electrodes 3 and a partition 6 is set on the work table 51. At this time, the transparent substrate 2 is heated by the substrate heat-insulating unit 63 via the work table 51. The cooling medium circulator 170 supplies the cooling medium 77 to the cooling medium jacket 69 to cool the nozzle 55. A droplet of the organic EL solution 71 is sprayed from at least one spray port 55a of the nozzle 55 to each region surrounded by the walls of the partition 6 by using the solution spray apparatus 750, forming an organic EL layer 4 in the surrounded region.

More specifically, each unit of the solution spray apparatus 750 is controlled by the controller 60 and operates as follows.

The driving device 52 intermittently conveys the transparent substrate 2 together with the work table 51 in the sub-scanning direction. While the transparent substrate 2 stops, the head 54 reciprocates at least once in the main scanning direction.

While the head 54 moves in the main scanning direction, the nozzle 55 passes immediately above the transparent electrode 3 of each pixel surrounded by the partition 6. While the nozzle 55 passes above the transparent electrode 3, it sprays one or a plurality of droplets of the EL solution 71 through its port or ports, toward the transparent electrode 3 of each pixel.

At this time, the nozzle 55 is cooled by the cooling medium jacket 69. This suppresses the stay of the solvent vaporized by cavitation in the organic EL solution 71 inside the nozzle 55. A predetermined amount of droplet can be continuously sprayed from the spray port 55a of the nozzle 55. The film thickness of the organic EL layer 4 by landed droplets does not become nonuniform between adjacent pixels.

By heating the transparent substrate 2, the droplet path is also heated. A droplet sprayed from the spray port 55a is heated before it reaches the transparent electrode 3 on the transparent substrate 2. The solvent evaporates before the droplet is deposited on the transparent electrode 3, and the droplet amount becomes smaller than the spray amount. The organic EL solution 71 can therefore be prevented from scattering to adjacent pixel or pixels, or running off over the partition 6. This minimizes mixing of organic EL solutions 71 of adjacent pixels in different emission colors.

After the head 54 reciprocates at least once in the main scanning direction, as described above, the driving device 52 conveys the work table 51 together with the transparent substrate 2 by a predetermined distance in the sub-scanning direction. After the transparent substrate 2 stops again, reciprocation of the head 54 and spraying of the EL solution 71 from the nozzle 55 are executed again. The solution spray apparatus 750 repeats the above-mentioned operation to form organic EL layers 4 in all regions surrounded by the partition 6.

Note that the head 54 may be so moved as to position the nozzle 55 to a predetermined position of the transparent electrode 3 and then temporarily stopped. The nozzle port 55a may spray one or a plurality of droplets of the EL solution 71 toward the transparent electrode 3. This operation may be repeated to sequentially form the organic EL layers 4 on the transparent electrodes 3.

After the end of forming the organic EL layers 4 by the solution spray apparatus 750, a film formation step by PVD, CVD, or the like is performed to form a counter electrode 7 on the organic EL layers 4 on one surface of the transparent substrate 2.

In the solution spray apparatus 750, the organic EL solution 71 sprayed as droplets from the nozzle 55 is heated by the substrate heat-insulating unit 63, and the organic EL solution 71 can be formed into a film in a desired pixel. The cooling medium jacket 69 suppresses vaporization of the organic EL solution 71 in the nozzle 55 caused by overheating of the nozzle 55 positioned above the substrate heat-insulating unit 63 by heat transferred from the substrate heat-insulating unit 63, and a desired amount of droplet can be sprayed from each nozzle 55. Organic EL layers 4R, 4G, and 4B can maintain thicknesses within a desired range, realizing an expression at a stable brightness and high emission color purity.

Figure 10:
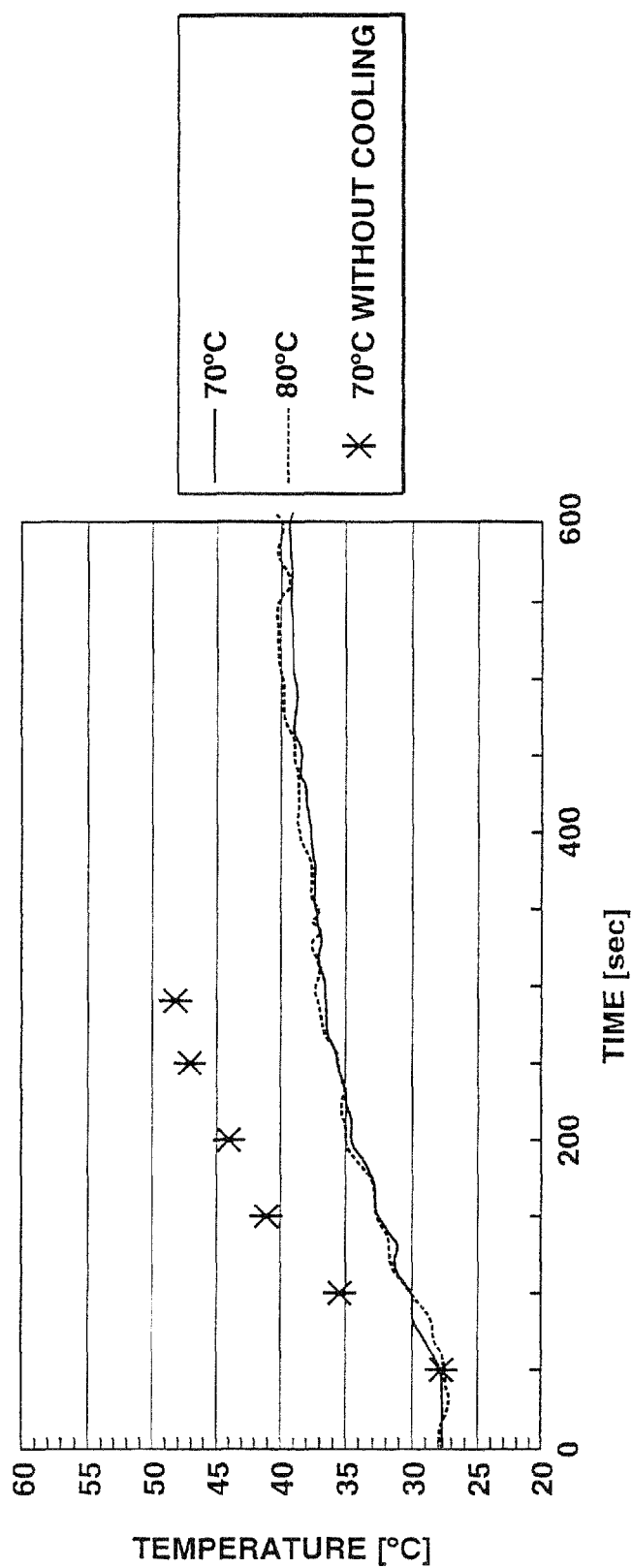
FIG. 10 is a graph showing the relationship between the elapsed time of droplet spray operation and the nozzle temperature.

The relationship between the time elapsed after the start of spray operation of the organic EL solution 71 and the temperature of the nozzle 55 in the solution spray apparatus will be explained with reference to FIG. 10. FIG. 10 is a graph showing the relationship between the time elapsed after the start of droplet spray operation and the temperature of the nozzle 55. In this measurement, the PEDOT solution was used as the organic EL solution 71.

"*"s in the graph of FIG. 10 represent a comparative example in which the heater is so controlled as to set the temperature of the work table 51 to 70° C. and the nozzle 55 is not cooled by using a solution spray apparatus obtained by excluding the cooling medium jacket 69, cooling medium circulator 170, and cooling medium discharge pipe 82 from the solution spray apparatus 750 in FIG. 9. In this case, when the time elapsed after the start of spraying droplets of the PEDOT solution reached 300 sec, the temperature of the nozzle 55 greatly exceeded 40° C. and reached 48.3° C. The solvent of the PEDOT solution vaporized and stayed in the nozzle 55 owing to overheating in the PEDOT solution supply line of the nozzle 55. Although the pump performed mechanical displacement, spraying of droplets of the PEDOT solution stopped. Accordingly, continuous spraying stopped.

The solid line in the graph of FIG. 10 represents a case in which the temperature of the work table 51 is heated to 70° C. in the solution spray apparatus 750 and the cooling medium circulator 170 is operated to cool the nozzle 55. In this case, even if the time elapsed after the start of spraying droplets of the PEDOT solution reached 600 sec, the temperature of the nozzle 55 did not exceed 40° C., and continuous, successive spraying of the PEDOT solution could be realized.

The dotted line in the graph of FIG. 10 represents a case in which the temperature of the work table 51 is controlled to 80° C. in the solution spray apparatus 750 and the cooling medium circulator 170 is operated to cool the nozzle 55. In this case, even if the time elapsed after the start of spraying droplets of the PEDOT solution reached 600 sec, the temperature of the nozzle 55 did not exceed 40° C., and continuous, successive spraying of the PEDOT solution could be realized.

According to the eighth embodiment, a droplet of the organic EL solution 71 is sprayed to a region surrounded by the walls of the partition 6 on the transparent substrate 2 while the transparent substrate 2 set on the work table 51 is heated by the substrate heat-insulating unit 63 and the nozzle 55 is cooled by the cooling medium jacket 69. Even in the use of the organic EL solution 71 containing a low-boiling-point solvent or high-vapor-pressure solvent, cooling of the nozzle 55 suppresses generation of a vaporized component in the organic EL solution 71 stayed in the nozzle 55. The organic EL solution 71 is filled in the nozzle 55, and a proper amount of the organic EL solution 71 can be sprayed. Since the transparent substrate 2 is heated, a droplet is quickly heated to dry the solvent in the organic EL solution 71 until the droplet reaches the heated transparent substrate 2. The droplet amount decreases to increase the viscosity of the organic EL solution 71. No droplet flows out to a desired surrounded region or scatter. In addition, the time till evaporation can be shortened.

Ninth Embodiment

Figure 11:
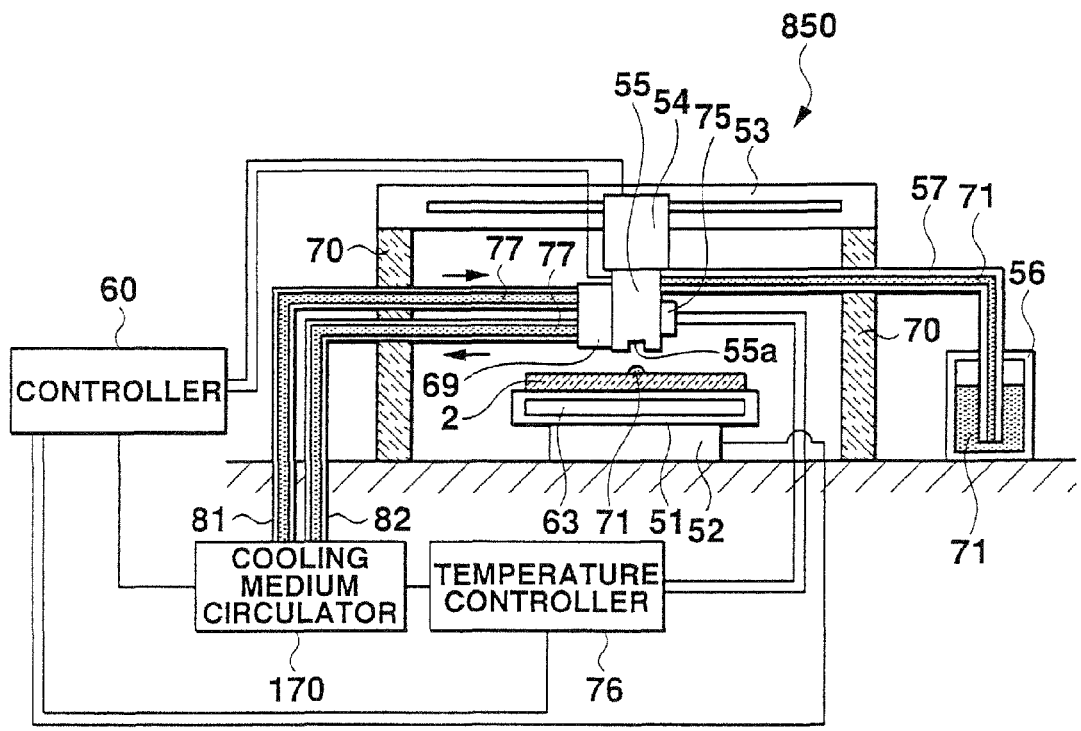
FIG. 11 is a schematic side view showing a solution spray apparatus according to the ninth embodiment of the present invention.

The ninth embodiment according to the present invention will be described with reference to FIG. 11. FIG. 11 is a schematic side view showing a solution spray apparatus 850 according to the ninth embodiment.

In the eighth embodiment, if the nozzle 55 is excessively cooled without any limitation, the temperature of the internal organic EL solution 71 excessively decreases to increase the viscosity. The droplet amount of the organic EL solution 71 sprayed from the spray port 55a may decrease. The ninth embodiment solves this problem by adopting a temperature adjustment means for adjusting a cooling function in a cooling medium circulator. The same reference numerals as in the solution spray apparatus 750 of the eighth embodiment denote the same parts in the solution spray apparatus 850 of the ninth embodiment, and a description thereof will be omitted. The solution spray apparatus 850 comprises a work table 51, a driving device 52, a guide 53, a head 54, at least one nozzle 55, an organic material solution tank 56, an EL solution supply pipe 57, a substrate heat-insulating unit 63, a cooling medium jacket 69 which is arranged on the nozzle 55 and receives a cooling medium 77, a cooling medium circulator 170 serving as the supply source of the cooling medium 77, a cooling medium supply pipe 81, a cooling medium discharge pipe 82, a temperature detector 75 which detects the temperatures of the nozzles 55, a temperature controller 76 which adjusts a cooling function in the cooling medium circulator 170 on the basis of temperature information of the nozzle 55 that is detected by the temperature detector 75, and a controller 60 which controls the whole solution spray apparatus 850.

The cooling medium circulator 170 is a circulation constant-temperature bath. The cooling medium circulator 170 comprises a tank which stores the cooling medium 77, a pump which pumps the cooling medium 77, and a temperature change means which heats and cools the cooling medium 77 in the tank. The pump pumps the cooling medium 77 in the tank to the cooling medium jacket 69 via the cooling medium supply pipe 81. The cooling medium 77 supplied to the cooling medium jacket 69 deprives the nozzle 55 of heat. The cooling medium 77 that absorbed heat is discharged to the cooling medium circulator 170 via the cooling medium discharge pipe 82. The cooling medium circulator 170 supplies the discharged cooling medium 77 into the internal tank. The controller 60 instructs the cooling medium circulator 170 to set the flow rate of the cooling medium 77 supplied to the cooling medium supply pipe 81 to a predetermined amount in accordance with temperature information from the temperature detector 75.

The temperature controller 76 controls the temperature change means of the cooling medium circulator 170, and adjusts the cooling medium 77 in the internal tank on the basis of temperature information of the nozzle 55 that is detected by the temperature detector 75. Adjustment of the temperature and/or flow rate is so controlled as to keep the temperature of the nozzle 55 constant. The controller 60 instructs the temperature controller 76 to set the cooling medium 77 in the cooling medium circulator 170 to a predetermined temperature in accordance with temperature information from the temperature detector 75.

A method of manufacturing an organic EL display panel 1 by using the solution spray apparatus 850 is almost the same as the method of manufacturing the organic EL display panel 1 by using the solution spray apparatus 750 in the eighth embodiment except the cooling procedure of the nozzle 55. To avoid a repetitive description, only the cooling procedure will be explained.

When a droplet of the organic EL solution 71 is sprayed from at least one port of the nozzle 55 of the solution spray apparatus 850, the controller 60 executes cooling control in accordance with information from the temperature detector 75. More specifically, the cooling medium circulator 170 supplies the cooling medium 77 to the cooling medium jacket 69, and the cooling medium 77 cools the nozzle 55. The substrate heat-insulating unit 63 heats the work table 51 to heat the nozzle 55 and its lower atmosphere by radial heat. The temperature controller 76 controls the temperature of the cooling medium 77 in the internal tank of the cooling medium circulator 170 so as to properly keep constant the temperature of the nozzle 55 that is detected by the temperature detector 75. In other words, the temperature of the cooling medium 77 supplied to the cooling medium jacket 69 is so controlled as to properly keep the temperature of the nozzle 55 constant by heating and cooling of the nozzle 55 and the flow rate balance of the cooling medium 77 controlled by the cooling medium circulator 170. The controller 60 also outputs a control signal for controlling the flow rate to the cooling medium circulator 170 on the basis of control information of the temperature controller 76 that is fed back to the controller 60. An appropriate temperature of the cooling medium 77 is a temperature at which the viscosity of the organic EL solution 71 is set to a proper value without generating any stay of a vaporized solvent in the organic EL solution 71 inside the nozzle 55. An appropriate temperature of the nozzle 55 may have a predetermined range.

According to the ninth embodiment, the temperature controller 76 controls the temperature of the cooling medium 77 supplied to the cooling medium jacket 69 to a temperature at which the viscosity of the organic EL solution 71 is properly kept constant. Continuous spraying of droplets of the organic EL solution 71 can be realized even by using the organic EL solution 71 containing a low-boiling-point solvent or high-vapor-pressure solvent. In addition, a high-quality organic EL display panel in which the viscosity of the organic EL solution 71 is properly kept constant, the droplet amount sprayed from the nozzle 55 is kept constant, and the film thickness of the organic EL layer is constant can be manufactured.

10th Embodiment

Figure 12:
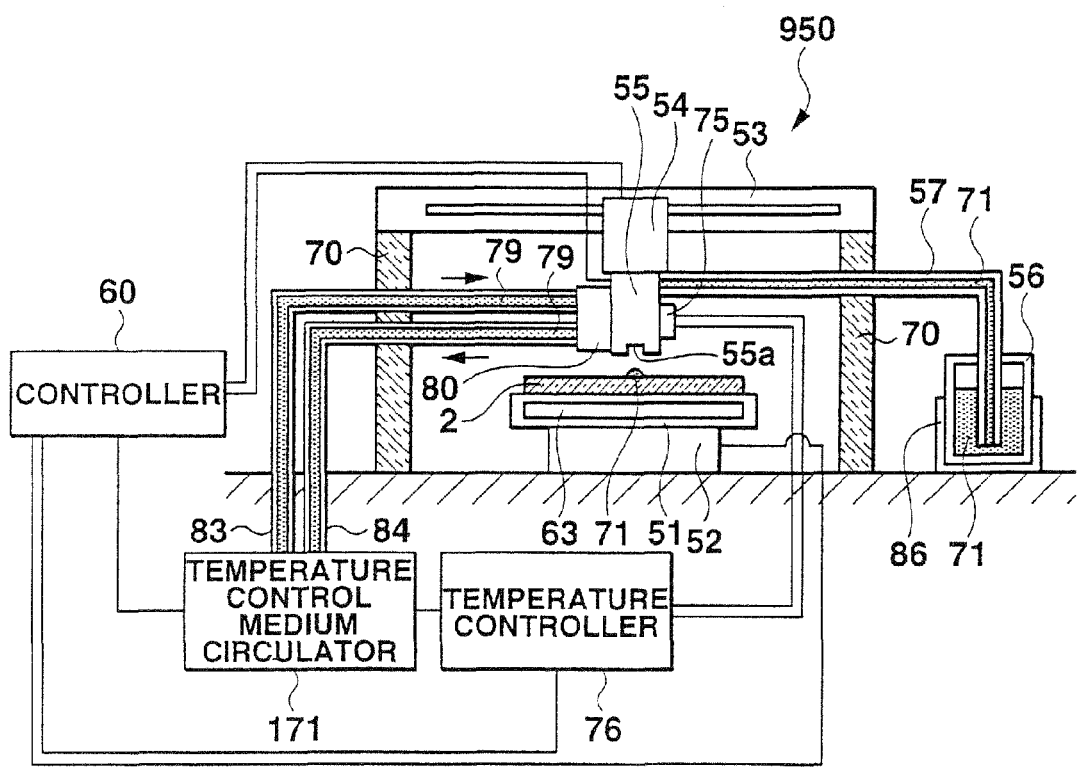
FIG. 12 is a schematic cross sectional view showing a solution spray apparatus according to the tenth embodiment of the invention.
Figure 13:
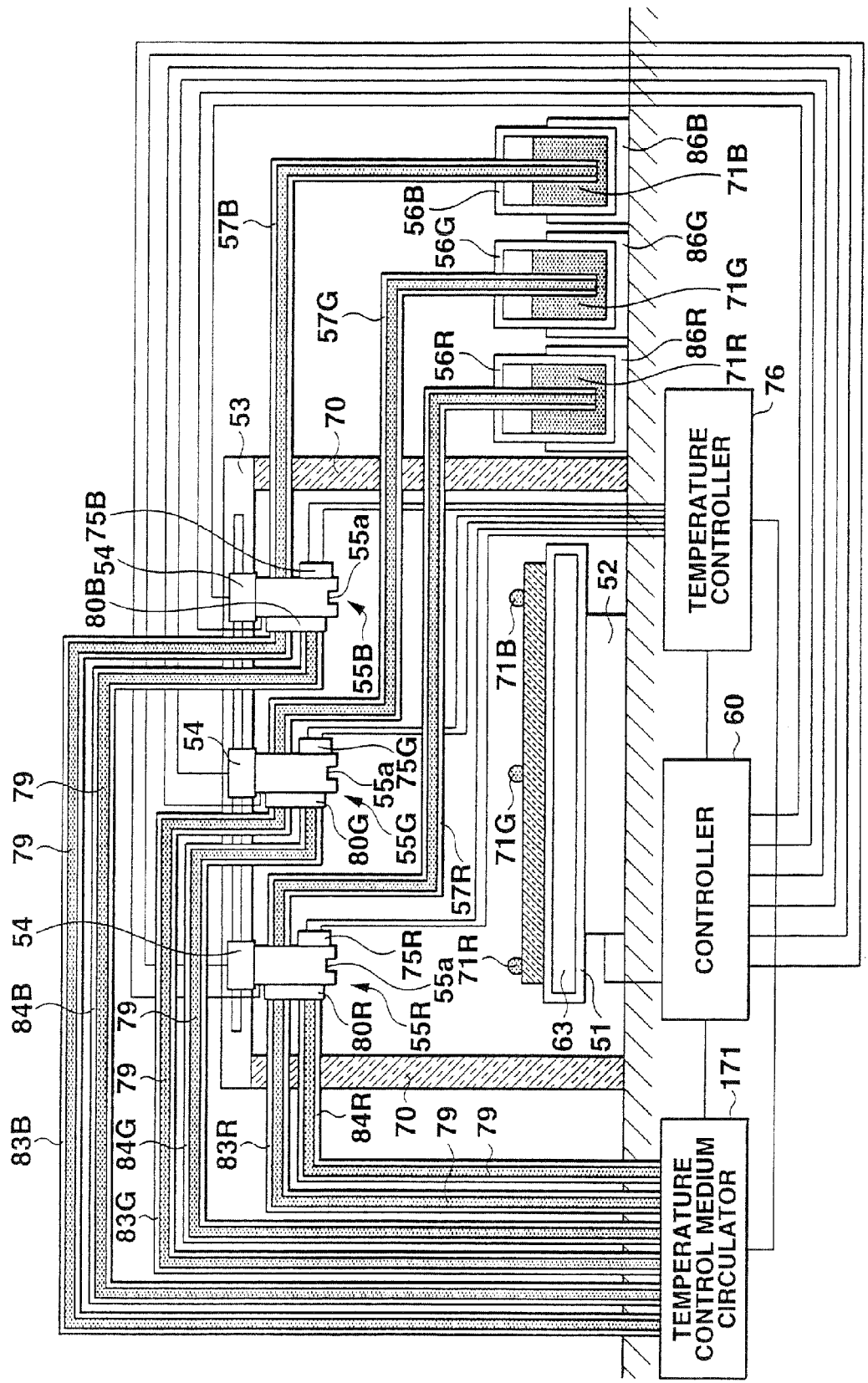
FIG. 13 is a schematic cross sectional view showing a modification of the present invention.

The 10th embodiment according to the present invention will be described with reference to FIG. 12. FIG. 12 is a schematic side view showing a solution spray apparatus 950 according to the 10th embodiment.

In the ninth embodiment, the cooling medium circulator 170 cools the organic EL solution 71 in the nozzle 55. To the contrary, the solution spray apparatus 950 employs a temperature control medium circulator 171 instead of the cooling medium circulator 170. In order to suppress the temperature rise or drop of an organic EL solution 71 in a nozzle 55 caused by an external factor such as a temperature outside the nozzle 55, the temperature control medium circulator 171 has a function of supplying a temperature control medium 79 set to a predetermined temperature via a temperature control medium supply pipe 83 to a temperature control medium jacket 80 arranged in contact with the nozzle 55, discharging via a temperature control medium discharge pipe 84 the temperature control medium 79 whose temperature is changed by the nozzle 55 in the temperature control medium jacket 80, returning the discharged temperature control medium 79 to the predetermined temperature again by a temperature controller 76, and circulating the temperature control medium 79 so as to flow through the temperature control medium supply pipe 83. The temperature controller 76 properly heats or cools the temperature control medium 79 circulated by the temperature control medium circulator 171 to a predetermined temperature. The temperature control medium 79 is preferably a medium such as diphenyl ether which has a large heat capacity per unit volume and high heat transfer performance and is chemically inert to a temperature adjusted by the temperature controller 76.

In the solution spray apparatus 950, the temperature controller 76 can cool and heat the temperature control medium 79. This can quickly solve the problem of insufficient volatilization of the solvent when the temperature of the organic EL solution 71 sprayed from the nozzle 55 decreases owing to excessive cooling. Further in the solution spray apparatus 950, a heat-insulating unit 86 keeps the organic EL solution 71 in an organic material solution tank 56 at a predetermined temperature regardless of the external temperature. When the heat transfer effect is small due to a small surface area or volume of the nozzle 55, and a large heat capacity is required due to a small amount of the internal organic EL solution 71 or continuous spraying of the organic EL solution 71, the organic EL solution 71 cannot be satisfactorily controlled to a predetermined temperature by heat transfer from the temperature control medium 79. Even in this case, the solution can be easily cooled inside the nozzle 55 and evaporated outside the nozzle 55 by heat-insulating the organic EL solution 71 to a certain degree.

The present invention is not limited to the above embodiments, and various modifications and design changes may be made without departing from the gist of the present invention.

For example, the solution spray apparatuses 50, 150, 250, 350, 450, 550, 650, 750, and 850 are used to manufacture the organic EL display panel 1. These apparatuses can also be used to manufacture a color filter or a color changing medium which absorbs short-wavelength light and emits longer-wavelength light. In the color filter or the color changing medium which changes short-wavelength light into long-wavelength light, a partition is formed in a matrix on a transparent substrate, similar to the organic EL display panel 1, and colored layers are formed in regions surrounded by the partition. These colored layers can be formed by the solution spray apparatus 50, 150, 250, 350, 450, 550, 650, 750, or 850. A material which forms the colored layer is different from one which forms the organic EL layer 4, but can be dissolved in an organic solvent.

The head 54 is movable in the main scanning direction in the above embodiments, but may be movable in the main scanning direction and sub-scanning direction, i.e., in a plane parallel to the upper surface of the work table 51. In this case, the work table 51 may be fixed. Similarly, the work table 51 may be movable in the main scanning direction and sub-scanning direction by the driving device 52. In this case, the head 54 may be fixed. In other words, one of the work table 51 and head 54 suffices to be movable relatively to the other in a plane parallel to the upper surface of the work table 51.

The heater which heats the EL solution 71 supplied from the organic material solution tank 56 to the nozzle 55 may be arranged in the EL solution supply pipe 57. In this case, the heat-insulating unit 58 may not be arranged around the organic material solution tank 56, and the heat-insulating unit 59 may not be arranged.

At least one of the heat-insulating units 58 and 59 is arranged in the solution spray apparatus 350, 450, 550, or 650 shown in FIG. 5, 6, 7, or 8, thereby improving the solvent volatilization effect.

In the eighth to 10th embodiments, the cooling medium jacket 69 (or temperature control medium jacket 80) is directly or indirectly arranged in tight contact with the nozzle 55, as an arrangement which holds a medium subjected to temperature control. However, the present invention is not limited to this. For example, a cooling medium jacket (or temperature control medium jacket) may be incorporated in the nozzle 55. Alternatively, a cooling medium jacket (or temperature control medium jacket) may be arranged on, e.g., a stay for attaching the nozzle 55 to the head 54.

The temperature control means is not limited to these jackets. The temperature control means may be a Peltier element which generates a temperature difference in two types of metals by energization and radiates heat, a heat radiation fin, a cooling fan, or the like. A plurality of members among these members and jackets may be combined.

Only the nozzle 55 is cooled by the cooling medium jacket 69 in the eighth and ninth embodiments, but the present invention is not limited to this. For example, a heater may be newly attached to the nozzle 55, and one or both of cooling by the cooling medium jacket 69 and heating by the heater may be executed for the nozzle 55. This arrangement can shorten the time until the temperature of the nozzle 55 reaches a proper temperature by heating the nozzle 55 after the start of activating the solution spray apparatus 850. The manufacturing time of the organic EL display panel 1 can therefore be shortened as a whole.

The nozzle 55 sprays droplets of the EL solution 71 in a single color in the above embodiments, but the present invention is not limited to this. As shown in FIG. 14, a red nozzle 55R, green nozzle 55G, and blue nozzle 55B which respectively spray EL solutions 71R, 71G, and 71B prepared by dissolving organic materials for EL films for emitting red light, green light, and blue light may be simultaneously scanned to simultaneously spray droplets of the EL solutions 71R, 71G, and 71B.

The red EL solution 71R stored in an organic material solution tank 56R is kept at a proper temperature by a red EL solution heat-insulating unit 86R. While the red EL solution 71R is kept at this temperature, it reaches the red nozzle 55R via a red EL solution supply pipe 57R. The heat-insulating unit 86R is set at a high temperature in advance in consideration of a temperature by which the temperature of the red EL solution 71R decreases by heat transfer to the red EL solution supply pipe 57R or the like. When the red EL solution 71R in the red nozzle 55R overheats or does not reach a predetermined temperature, the temperature control medium circulator 171 supplies the temperature control medium 79 set to the predetermined temperature into the red nozzle 55R via a temperature control medium supply pipe 83R so as to set the red EL solution 71R to the predetermined temperature. The temperature control medium circulator 171 then receives the temperature control medium 79 in the red nozzle 55R via the temperature control medium discharge pipe 84. The temperature control medium 79 may be a cooling or heating medium, and is maintained at a temperature lower than the boiling point of the red EL solution 71R.

The green EL solution 71G stored in an organic material solution tank 56G is kept at a proper temperature by a green EL solution heat-insulating unit 86G. While the green EL solution 71G is kept at this temperature, it reaches the green nozzle 55G via a green EL solution supply pipe 57G. The heat-insulating unit 86G is set at a high temperature in advance in consideration of a temperature by which the temperature of the green EL solution 71G decreases by heat transfer to the green EL solution supply pipe 57G or the like. When the green EL solution 71G in the green nozzle 55G overheats or does not reach a predetermined temperature, the temperature control medium circulator 171 supplies the temperature control medium 79 set to the predetermined temperature into the green nozzle 55G via a temperature control medium supply pipe 83G so as to set the green EL solution 71G to the predetermined temperature. The temperature control medium circulator 171 then receives the temperature control medium 79 in the green nozzle 55G via the temperature control medium discharge pipe 84. The temperature control medium 79 may be a cooling or heating medium, and is maintained at a temperature lower than the boiling point of the green EL solution 71G.

The blue EL solution 71B stored in an organic material solution tank 56G is kept at a proper temperature by a blue EL solution heat-insulating unit 86B. While the blue EL solution 71B is kept at this temperature, it reaches the blue nozzle 55B via a blue EL solution supply pipe 57B. The heat-insulating unit 86B is set at a high temperature in advance in consideration of a temperature by which the temperature of the blue EL solution 71B decreases by heat transfer to the blue EL solution supply pipe 57B or the like. When the blue EL solution 715 in the blue nozzle 55B overheats or does not reach a predetermined temperature, the temperature control medium circulator 171 supplies the temperature control medium 79 set to the predetermined temperature into the blue nozzle 55B via a temperature control medium supply pipe 83B so as to set the blue EL solution 71B to the predetermined temperature. The temperature control medium circulator 171 then receives the temperature control medium 79 in the blue nozzle 55B via the temperature control medium discharge pipe 84. The temperature control medium 79 may be a cooling or heating medium, and is maintained at a temperature lower than the boiling point of the blue EL solution 71B.

The EL solutions 71R, 71G, and 71B are so set as to be independently sprayed from the red nozzle 55R, green nozzle 55G, and blue nozzle 55B. The respective EL solutions 71R, 71G, and 71B may be kept at different temperatures in the red nozzle 55R, green nozzle 55G, and blue nozzle 55B in accordance with the characteristics of solutes and solvents in the EL solutions 71R, 71G, and 71B.

The red EL solution heat-insulating unit 86R, green EL solution heat-insulating unit 86G, and blue EL solution heat-insulating unit 86B may keep the EL solutions 71R, 71G, and 7B at different temperatures. The temperature control medium circulator 171 may circulate different temperature control media 79 supplied from the temperature control medium supply pipes 83R, 83G, and 83B so as to set the EL solutions 71R, 71G, and 71B to different temperatures.

The red nozzle 55R, green nozzle 55G, and blue nozzle 55B may simultaneously spray the red EL solution 71R, green EL solution 71G, and blue EL solution 71B. Alternatively, after EL solution spray operation of a nozzle for a given color ends, a nozzle for another emission color may start spraying another EL solution.

The amounts of the EL solutions 71R, 71G, and 71B sprayed to the corresponding pixels may be different in accordance with characteristics such as the emission characteristics of emission materials in the EL solutions 71R, 71G, and 71B, the solute solubility, and the solvent volatility. The kinds of solvents of the EL solutions 71R, 71G, and 71B may be appropriately different from each other.

The spray means of the nozzle 55 is piezoelectric in the above embodiments, but the present invention is not limited to this. For example, an electrostatic suction spray means may be employed. The electrostatic suction spray means charges the nozzle 55 and organic EL solution 71. A small pressure is applied to the organic EL solution 71 in the nozzle 55 to form the meniscus of the organic EL solution 71 in the nozzle 55. In this state, a potential opposite in sign to that of the nozzle 55 is applied to the work table 51. An electrostatic attraction is applied to the organic EL solution 71 in the meniscus state to suck the organic EL solution 71 from the nozzle 55. Accordingly, droplets of the organic EL solution 71 are sprayed from the spray port 55a.

Alternatively, a thermal jet spray means may also be employed. The thermal jet spray means instantaneously film-boils the organic EL solution 71 in the nozzle 55 by a heating member. Bubbles are generated in the organic EL solution 71 to change the internal pressure of the nozzle 55. As a result, droplets of the organic EL solution 71 are sprayed from the spray port 55a. In the above some embodiments, the nozzle 55 is cooled to suppress generation of a gas of a solvent stayed in the nozzle 55. However, the solution spray apparatus is so constituted as to permit an instantaneous solvent gas by heating of the heating member in the thermal jet spray means. That is, in the use of the thermal jet spray means, the nozzle 55 is so cooled as not to generate any solvent gas except the purpose of spraying droplets.

Each of the above embodiments may adopt any one of the heat-insulating unit 58, nozzle heat-insulating unit 59, substrate heat-insulating unit 63, radial heater 64, heating unit 65, fan 66, heat insulator 67, temperature controller 76, temperature measurement unit 78, cooling medium circulator 170, and temperature control medium circulator 171. The present invention is not limited to this, and a plurality of means among the heat-insulating means and measurement means may be arbitrary combined to spray the EL solution.

According to the present invention, a droplet sprayed from the spray port can easily evaporate, no landed droplet runs off from a surrounded region, and no solutions in adjacent surrounded regions mix. A larger-volume droplet of even a solvent a solubility in which is low can be sprayed at once. Thus, the film formation time taken to form the solute to a proper film thickness in the surrounded region can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solution spray apparatus comprising:
   a table which supports a substrate having an electrode;
   at least one nozzle which sprays at least one droplet of a solution containing an EL material and a solvent onto the electrode of the substrate;
   a heating-insulating unit which heats the table to vaporize the solvent and insulates the table;
   a driving device which moves the table; and a heat insulator which is interposed between the heating-insulating unit and the driving device.

2. A spraying method comprising:
heating a solution containing an EL material and a solvent;
supplying the heated solution to a nozzle;
spraying the heated solution from the nozzle onto an electrode of a substrate on a table;
heating the table to vaporize the solvent by a heating-insulating unit; and
moving the table by a driving device;
wherein the driving device is thermally insulated from the heating-insulation unit by a heat insulator interposed between the heating-insulating unit and the driving device.

3. The method according to claim 2, wherein a temperature of the solution in the nozzle is kept lower than a boiling point of the solution.

4. The method according to claim 2, wherein a temperature of the solution sprayed from the nozzle is kept higher than a temperature of the solution in the nozzle.

5. A spraying method comprising:
heating a solution containing an EL material and a solvent in a nozzle to a temperature that is lower than a boiling point of the solution;
spraying the heated solution from the nozzle onto an electrode of a substrate on a table;
heating the table to vaporize the solvent by a heating-insulating unit; and
moving the table by a driving device;
wherein the driving device is thermally insulated from the heating-insulating unit by a heat insulator interposed between the heating-insulating unit and the driving device.

6. A spraying method comprising:
detecting a temperature of a nozzle;
controlling a temperature of a solution containing an EL material and a solvent in the nozzle to fall within a predetermined temperature range, based on the detected temperature of the nozzle;
spraying the solution toward an electrode of a substrate on a table from the nozzle;
heating the table to vaporize the solvent by a heating-insulating unit; and
moving the table by a driving device;
wherein the driving device is thermally insulated from the heating-insulating unit by a heat insulator interposed between the heating-insulating unit and the driving device.

7. An EL layer forming apparatus comprising:
a table which supports a substrate having an electrode;
at least one nozzle which sprays at a solution containing an EL material and a solvent toward the electrode of the substrate;
a heating unit which heats the table to vaporize the solvent;
a driving device which moves the table; and
a heat insulator which is interposed between the heating unit and the driving device.

8. The apparatus according to claim 7, wherein the nozzle sprays the solution as a droplet.

9. The apparatus according to claim 7, wherein the heating unit heats the atmosphere above the substrate.

10. The apparatus according to claim 7, further comprising:
a temperature detector which detects a temperature of the nozzle; and
a temperature controller which controls a temperature of the solution in the nozzle based on the temperature of the nozzle detected by the temperature detector.

11. An EL layer forming apparatus comprising:
a table which supports a substrate;
at least one nozzle which sprays a solution containing an EL material and a solvent toward an electrode of the substrate;
a heating unit which heats the table to dry the solution by vaporizing the solvent;
a driving device which moves the table; and
a heat insulator which is interposed between the heating unit and the driving device.

12. The apparatus according to claim 11, wherein the nozzle sprays the solution as a droplet.

13. The apparatus according to claim 11, wherein the heating unit heats the atmosphere above the substrate.

14. The apparatus according to claim 11, further comprising:
a temperature detector which detects a temperature of the nozzle; and
a temperature controller which controls a temperature of the solution in the nozzle based on the temperature of the nozzle detected by the temperature detector.

15. A method of forming an EL layer comprising:
spraying a solution containing an EL material and a solvent toward an electrode of a substrate which is supported on a table;
heating the table to vaporize the solvent to deposit the EL material by a heating unit; and
moving the table by a driving device;
wherein the driving device is thermally insulated from the heating unit by a heat insulator interposed between the heating unit and the driving device.

16. The method according to claim 15, wherein the solution is sprayed as a droplet.

17. The method according to claim 15, wherein the heated table heats the atmosphere above the substrate.

18. The method according to claim 15, wherein the solution is heated before spraying.

* * * * *